(12) United States Patent
Kim et al.

(10) Patent No.: US 11,314,919 B2
(45) Date of Patent: Apr. 26, 2022

(54) SEMICONDUCTOR DEVICE AND METHOD OF FABRICATING THE SAME

(71) Applicant: Samsung Electronics Co., Ltd., Suwon-si (KR)

(72) Inventors: Yongdeok Kim, Hwaseong-si (KR); Munjun Seo, Seoul (KR); Bonghyun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/022,233

(22) Filed: Sep. 16, 2020

(65) Prior Publication Data

US 2021/0174001 A1 Jun. 10, 2021

(30) Foreign Application Priority Data

Dec. 4, 2019 (KR) .......................... 10-2019-0159600
Jun. 15, 2020 (KR) .......................... 10-2020-0072141

(51) Int. Cl.
*G06F 30/30* (2020.01)
*G06F 30/3953* (2020.01)
(Continued)

(52) U.S. Cl.
CPC ............ *G06F 30/3953* (2020.01); *G03F 1/36* (2013.01); *G06F 30/392* (2020.01); *G06F 30/398* (2020.01)

(58) Field of Classification Search
CPC . H01L 2224/73265; H01L 2924/13091; H01L 23/528; H01L 27/1104; H01L 2224/73215; H01L 21/845; H01L 27/2463; H01L 2224/80896; H01L 2225/06544; H01L 23/485; H01L 2224/73204; H01L 27/14603; H01L 23/544; H01L 23/5222; H01L 29/41766; H01L 2924/1433; H01L 27/1211; H01L 21/823842; H01L 21/823431; H01L 21/823437; H01L 21/823462; H01L 21/823468; H01L 2224/92125; G06F 30/394; G06F 30/392; G06F 30/327; G06F 30/39; G06F 21/32;
(Continued)

(56) References Cited

U.S. PATENT DOCUMENTS 8,095,903 B2 1/2012 Birch et al.
8,173,491 B2 5/2012 Law et al.
(Continued)

FOREIGN PATENT DOCUMENTS

KR 1020190037046 A 4/2019

*Primary Examiner* — Binh C Tat
(74) *Attorney, Agent, or Firm* — Muir Patent Law, PLLC

(57) ABSTRACT

Disclosed are a semiconductor device and a method of fabricating the same. The semiconductor device includes an area-oriented region and a performance-oriented region, standard cells disposed on each of the area-oriented region and the performance-oriented region, and a routing metal layer on the standard cells. The routing metal layer includes first routing lines on the area-oriented region and second routing lines on the performance-oriented region. The smallest line width of the first routing lines is a first width, the smallest line width of the second routing lines is a second width greater than the first width, a pitch between the first routing lines is a first pitch, and a pitch between the second routing lines is a second pitch greater than the first pitch.

17 Claims, 24 Drawing Sheets

(51) Int. Cl.
     *G03F 1/36*          (2012.01)
     *G06F 30/398*     (2020.01)
     *G06F 30/392*     (2020.01)

(58) Field of Classification Search
     CPC .. G06F 2221/2113; G06F 3/167; G06F 1/163;
             G06F 21/79; G06F 21/86; G06F 11/261;
             G06F 2221/2129; G06F 3/00; G06F
             2111/04; G06F 2111/20; G06F 2117/02;
             G06F 2119/12; G06F 3/017; G06F 30/30;
             G06F 30/33; G06F 1/1626; G06F
             12/0866; G06F 2212/2022; G06F
             30/3312; G06F 30/398
     USPC ..................................................... 716/50–56
     See application file for complete search history.

(56)             References Cited

U.S. PATENT DOCUMENTS

| | | | |
|---|---|---|---|
| 8,661,395 | B2 | 2/2014 | Liu et al. |
| 8,788,999 | B1 | 7/2014 | Baldsdon et al. |
| 9,825,032 | B1 * | 11/2017 | Bentley ................ H01L 27/092 |
| 9,836,570 | B1 | 12/2017 | Azuma et al. |
| 10,162,925 | B2 | 12/2018 | Chuang et al. |
| 2018/0004883 | A1 * | 1/2018 | Yuan ..................... G06F 30/392 |
| 2018/0308796 | A1 * | 10/2018 | Peng ................... H01L 23/5286 |
| 2018/0314771 | A1 | 11/2018 | Lee et al. |

* cited by examiner

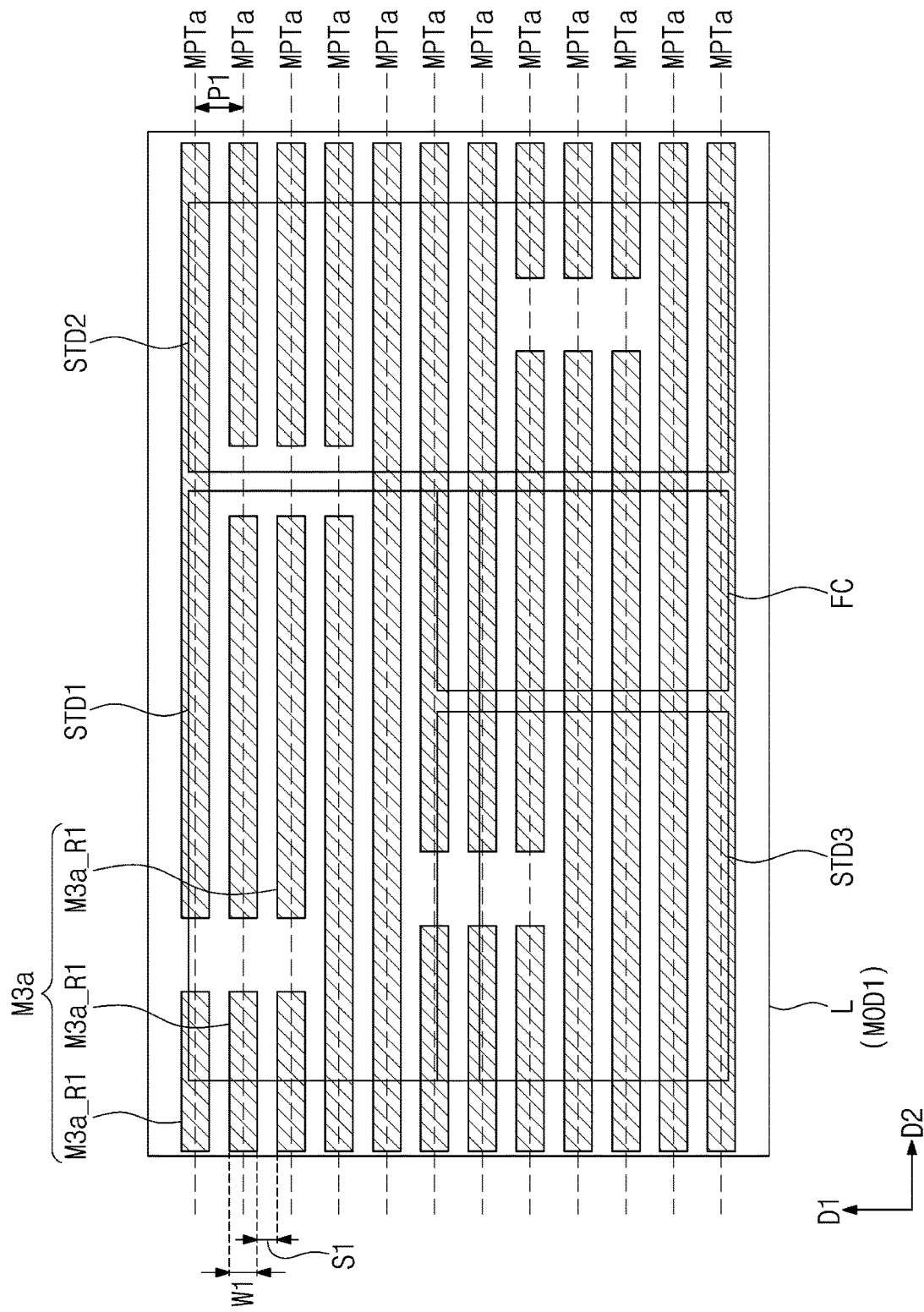

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2019-0159600, filed on Dec. 4, 2019, and Korean Patent Application No. 10-2020-0072141, filed on Jun. 15, 2020, in the Korean Intellectual Property Office, the entire contents of both of which are hereby incorporated by reference.

BACKGROUND OF THE INVENTION

The present disclosure relates to a semiconductor device and a method of fabricating the same, and in particular, to a semiconductor device including a system-on-chip and a method of fabricating the same.

Due to their small-sized, multifunctional, and/or low-cost characteristics, semiconductor devices are recognized as important elements in the electronic industry. The semiconductor devices are classified into a semiconductor memory device for storing data, a semiconductor logic device for processing data, and a hybrid semiconductor device including both of memory and logic elements. As the electronic industry advances, there is an increasing demand for semiconductor devices with improved characteristics. For example, there is an increasing demand for semiconductor devices with high reliability, high performance, and/or multiple functions. To meet this demand, complexity and/or integration density of semiconductor devices are being increased.

SUMMARY

An embodiment of the inventive concept provides a semiconductor device with high integration density and improved electric characteristics and a method of fabricating the same.

According to an embodiment of the inventive concept, a semiconductor device may include an area-oriented region and a performance-oriented region, standard cells disposed on each of the area-oriented region and the performance-oriented region, and a routing metal layer on the standard cells. The routing metal layer may include first routing lines on the area-oriented region and second routing lines on the performance-oriented region. The smallest line width of the first routing lines may be a first width, the smallest line width of the second routing lines may be a second width greater than the first width, a pitch between the first routing lines may be a first pitch, and a pitch between the second routing lines may be a second pitch greater than the first pitch.

According to an embodiment of the inventive concept, a semiconductor device may include an area-oriented region and a performance-oriented region, standard cells disposed on each of the area-oriented region and the performance-oriented region, and a routing metal layer on the standard cells. The routing metal layer may be one of a third metal layer and metal layers thereon. A pattern density of the routing metal layer on the area-oriented region may be greater than a pattern density of the routing metal layer on the performance-oriented region. The smallest line width of the routing metal layer on the area-oriented region may be smaller than the smallest line width of the routing metal layer on the performance-oriented region. The smallest space of the routing metal layer on the area-oriented region may be smaller than the smallest space of the routing metal layer on the performance-oriented region.

According to an embodiment of the inventive concept, a semiconductor device may include an area-oriented region and a performance-oriented region on a semiconductor chip, standard cells disposed on each of the area-oriented region and the performance-oriented region, and a routing metal layer on the standard cells. Each of the standard cells may include a first active pattern on a PMOSFET region, a second active pattern on an NMOSFET region, a device isolation layer covering a lower side surface of each of the first and second active patterns, each of the first and second active patterns having a protruding upper portion protruding above the device isolation layer, a gate electrode crossing the protruding upper portions of the first and second active patterns, a first source/drain pattern provided on the first active pattern and to a side of the gate electrode, a second source/drain pattern provided on the second active pattern and to a side of the gate electrode, a gate dielectric pattern interposed between the gate electrode and the protruding upper portion of each of the first and second active patterns, a gate spacer provided on a side surface of the gate electrode and extended along with the gate electrode, a gate capping pattern provided on a top surface of the gate electrode and extended along the gate electrode, a first interlayer insulating layer on the gate capping pattern, an active contact provided to penetrate the first interlayer insulating layer and electrically connected to at least one of the first and second source/drain patterns, a gate contact provided to penetrate the first interlayer insulating layer and electrically connected to the gate electrode, a first metal layer provided in a second interlayer insulating layer on the first interlayer insulating layer, and a second metal layer provided in a third interlayer insulating layer on the second interlayer insulating layer. The routing metal layer may be disposed on the second metal layer. A pattern density of the routing metal layer on the area-oriented region may be greater than a pattern density of the routing metal layer on the performance-oriented region. The smallest line width of the routing metal layer on the area-oriented region may be smaller than the smallest line width of the routing metal layer on the performance-oriented region. The smallest space of the routing metal layer on the area-oriented region may be smaller than the smallest space of the routing metal layer on the performance-oriented region.

According to an embodiment of the inventive concept, a method of fabricating a semiconductor device may include disposing a standard cell on each of an area-oriented region and a performance-oriented region and performing a routing operation on the standard cells. The performing of the routing operation may include defining first routing tracks on the area-oriented region, defining second routing tracks on the performance-oriented region, disposing first routing patterns on the first routing tracks, respectively, and disposing second routing patterns on the second routing tracks, respectively. A pitch between the first routing tracks may be a first pitch, and a pitch between the second routing tracks may be a second pitch greater than the first pitch. The smallest line width of the first routing patterns may be a first width, and the smallest line width of the second routing patterns may be a second width greater than the first width.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 6A and 7A are layout plan views illustrating how to perform a routing operation on a first region.

It should be noted that these figures are intended to illustrate the general characteristics of methods, structure, and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions, and/or structural elements may be reduced or exaggerated for clarity. The use of similar or identical reference numbers in the various drawings is intended to indicate the presence of a similar or identical element or feature.

DETAILED DESCRIPTION

Figure 1:
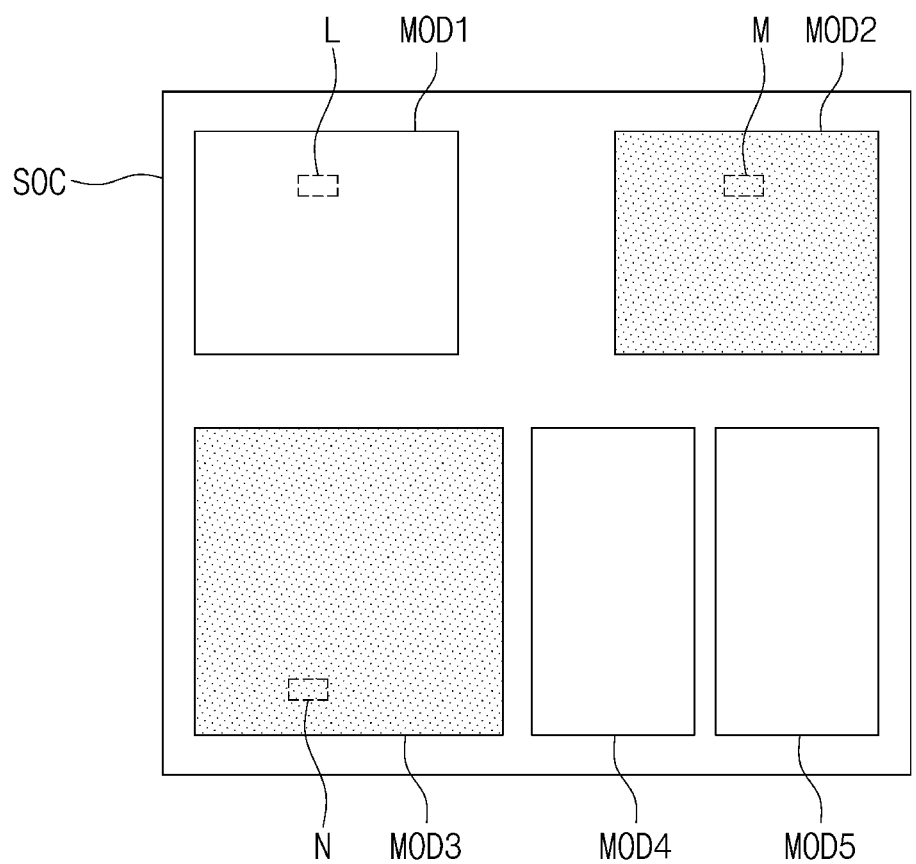
FIG. 1 is a plan view schematically illustrating a semiconductor chip, according to an example embodiment of the inventive concept.

FIG. 1 is a plan view schematically illustrating a semiconductor chip, according to an example embodiment of the inventive concept. Referring to FIG. 1, a semiconductor chip SOC may be provided. In an embodiment, the semiconductor chip SOC may be a system-on-chip.

The semiconductor chip SOC may include a plurality of modules MOD1-MOD5. For example, the semiconductor chip SOC may include first to fifth modules MOD1-MOD5, which are two-dimensionally arranged on the semiconductor chip SOC.

Each of the first to fifth modules MOD1-MOD5 may include at least one of a central processing unit (CPU), a graphics processing unit (GPU), a memory controller, a nonvolatile memory controller, or a universal serial bus (USB) interface.

Each of the second and third modules MOD2 and MOD3 may be a high performance module, for which a high speed operation property is required. For example, each of the second and third modules MOD2 and MOD3 may be a performance-oriented module and may be, for example, the CPU or the GPU. In the performance-oriented module, an operation speed of the module is more important than an integration density of the module (i.e., an area of the module).

Each of the first, fourth, and fifth modules MOD1, MOD4, and MOD5 may be a high integration density module, for which a small area property is required. For example, each of the first, fourth, and fifth modules MOD1, MOD4, and MOD5 may be an area-oriented module and may be, for example, the memory controller, the nonvolatile memory controller, or the USB interface. The area-oriented module, unlike the performance-oriented module, does not require a fast operation speed, but it is desirable that the area-oriented module has a high integration density to reduce an area of the semiconductor chip SOC.

In an example embodiment, the first module MOD1, the second module MOD2, and the third module MOD3 may include a first region L, a second region M, and a third region N, respectively. The first module MOD1 may be an area-oriented region, and each of the second region M and the third region N may be a performance-oriented region.

Figure 2:
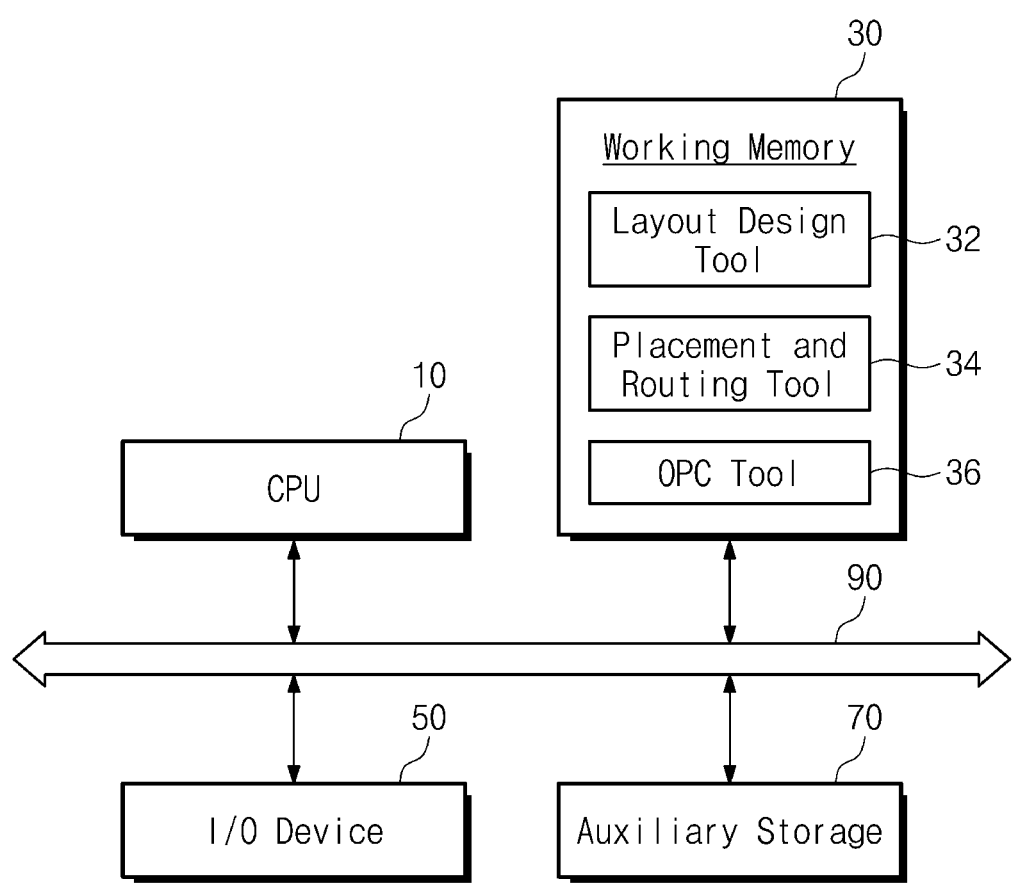
FIG. 2 is a block diagram illustrating a computer system which is configured to execute a semiconductor design process, according to an example embodiment of the inventive concept.

FIG. 2 is a block diagram illustrating a computer system which is configured to execute a semiconductor design process, according to an example embodiment of the inventive concept. Referring to FIG. 2, a computer system may include a processing unit (CPU) 10, a working memory 30, an input-output device 50, and an auxiliary storage 70. In an example embodiment, the computer system may be provided in the form of a customized system, which is configured to execute a layout design step according to the inventive concept. Furthermore, the computer system may be configured to carry out various design and check simulation programs.

The CPU 10 may be configured to run a variety of software programs, such as application programs, operating systems, and device drivers, which are executed on the computer system. The CPU 10 may run an operating system loaded on the working memory 30. Furthermore, the CPU 10 may run various application programs, which are executed based on the operating system. For example, the CPU 10 may execute a layout design tool 32, a placement and routing tool 34, and/or an optical proximity correction (OPC) tool 36, which are loaded on the working memory 30.

The operating system or the application programs may be loaded on the working memory 30. For example, when the computer system starts a booting operation, an image of the operating system (not shown) stored in the auxiliary storage 70 may be loaded on the working memory 30 in accordance with a predetermined booting sequence. In the computer system, the overall input/output operations may be managed by the operating system. Similarly, some application programs, which is selected by a user or is provided for basic services, may be loaded on the working memory 30.

The layout design tool 32, which is used for a layout design process, may be loaded on the working memory 30 from the auxiliary storage 70. The placement and routing tool 34, which is used to place the designed standard cells and to route the placed standard cells, may be loaded on the working memory 30 from the auxiliary storage 70. The OPC tool 36, which is used to execute an OPC process on the designed layout data, may be loaded on the working memory 30 from the auxiliary storage 70.

The layout design tool 32 may be configured to change biasing data for some layout patterns; for example, the layout design tool 32 may be configured to allow the specific layout patterns to have shapes and positions different from those given by a design rule. Furthermore, the layout design tool 32 may be configured to execute a design rule check (DRC) operation, under the conduction of the changed bias data. The working memory 30 may be one of volatile memory devices (e.g., static or dynamic random access memory (SRAM or DRAM) devices) or nonvolatile memory devices (e.g., PRAM, MRAM, ReRAM, FRAM, and NOR FLASH memory devices).

The input-output device 50 may be configured to control user's input and output data through user interface devices. For example, the input-output device 50 may include a keyboard or a monitor, which are used to receive relevant information from a designer. By using the input-output device 50, the designer may receive information on regions or data paths of a semiconductor device, which are needed to have adjusted operating characteristics. The input-output device 50 may also be a display device used to display a status or result of a process executed by the OPC tool 36.

The auxiliary storage 70 may be provided as a storage medium of the computer system. The auxiliary storage 70 may be used to store the application programs, the image of the operating system, and various kinds of data. The auxiliary storage 70 may be or include one of memory cards (e.g., MMC, eMMC, SD, MicroSD, and so forth), a hard disk drive (HDD), or a solid state drive (SSD). The auxiliary storage 70 may include a NAND FLASH memory device with a large memory capacity. In an example embodiment, the auxiliary storage 70 may include next-generation non-volatile memory devices (e.g., PRAM, MRAM, ReRAM, and FRAM devices) or a NOR FLASH memory device.

A system interconnector 90 may be further provided as a system bus for an internal network of the computer system. The CPU 10, the working memory 30, the input-output device 50, and the auxiliary storage 70 may be electrically connected to each other through the system interconnector 90 to exchange data between them. However, the structure of the system interconnector 90 may not be limited to this example, and in an embodiment, an additional data-exchanging element may be further provided to improve the efficiency in a data processing process.

Figure 3:
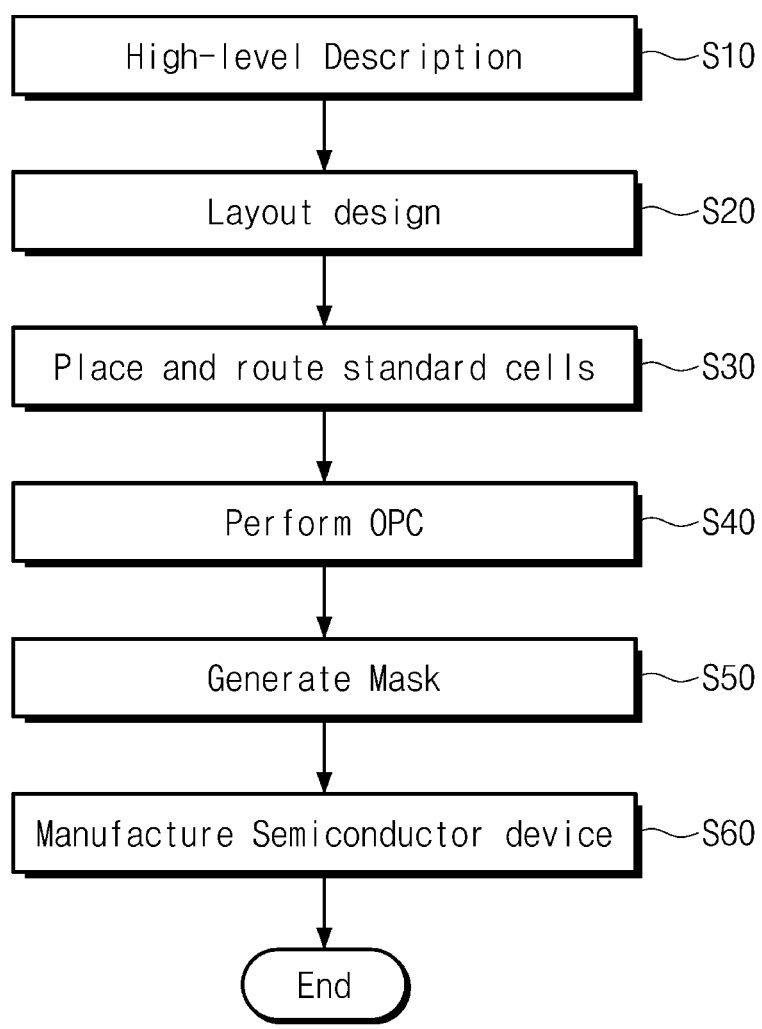
FIG. 3 is a flow chart illustrating a method of designing and fabricating a semiconductor device, according to an example embodiment of the inventive concept.

FIG. 3 is a flow chart illustrating a method of designing and fabricating a semiconductor device, according to an example embodiment of the inventive concept.

Referring to FIG. 3, a high-level design step may be performed on a semiconductor integrated circuit using the computer system described with reference to FIG. 2 (in S10). For example, in the high-level design process, an integrated circuit, which is a target object in a design process, may be described in terms of a high-level computer language. In an embodiment, the C language may be an example of the high-level computer language. Circuits designed by the high-level design step may be more concretely described by a register-transfer-level (RTL) coding or a simulation. Furthermore, codes generated by the RTL coding may be converted into a netlist, and the results may be combined to describe the entirety of the semiconductor device. The combined schematic circuit may be verified by a simulation tool, and in certain cases, an adjusting step may be further performed in consideration of a result of the verification step.

A layout design step may be performed to realize a logically-prepared form of the semiconductor integrated circuit on a silicon substrate (in S20). For example, the schematic circuit prepared in the high-level design step or the corresponding netlist may be referred during the layout design process.

A cell library, which is used for the layout design process, may contain information on operation, speed, and power consumption of a standard cell. Most of the layout design tools may be configured to define a cell library, which is used to represent a gate-level circuit in the form of a layout. Here, the layout may be prepared to define geometrical features (e.g., shapes, positions, or dimensions) of patterns, which are used to form transistors and metal interconnection lines to be actually integrated on a silicon substrate. For example, in order to actually form an inverter circuit on a silicon substrate, it may be necessary to property place layouts for patterns (e.g., PMOS, NMOS, N-WELL, gate electrodes, and metal interconnection lines thereon). For this, a searching operation may be performed to choose the most suitable inverter layout from the inverter layouts which have been stored in the cell library.

A step of placing and routing various standard cells, which are stored in the cell library, may be performed (in S30). For example, the standard cells may be two-dimensionally placed. Then, high-level interconnection lines (e.g., routing lines) may be placed on the placed standard cells. The routing step may be performed to connect the placed standard cells to each other in the previously-designed manner. The steps of placing and routing the standard cells may be automatically executed by the placement and routing tool 34.

After the routing is performed, a verification may be performed on the layout to check whether there is a portion violating the given design rule. In an example embodiment, the verification step may include evaluating verification items, such as a design rule check (DRC), an electrical rule check (ERC), and a layout vs schematic (LVS). Here, the DRC may be performed to evaluate whether the layout meets the given design rule, the ERC may be performed to evaluate whether there is an electrical disconnection issue in the layout, and the LVS may be performed to evaluate whether the layout is prepared to coincide with the gate-level netlist.

An OPC step may be performed (in S40). In general, optical proximity effects may occur when a photolithography process is performed on a silicon wafer using a photomask, which is manufactured based on the designed layout. The OPC step may be performed to correct the optical proximity or distortion issues in the photolithography process. For example, in the OPC step, the layout may be modified to reduce a difference in shape between designed patterns and actually-formed patterns, which may be caused by the optical proximity effects or during an exposure step of the photolithography process. As a result of the OPC step, the designed shapes and positions of the layout patterns may be slightly changed or biased.

A photomask may be generated, based on the layout modified by the OPC step (in S50). In general, the photomask may be manufactured by patterning a chromium layer, which is formed on a glass substrate, in such a way as to depict the layout pattern.

The manufactured photomask may be used to manufacture a semiconductor device (in S60). In the actual fabricating process, various exposing and etching steps may be performed or repeated to sequentially form patterns, which are defined in the layout design process, on a silicon substrate.

Figure 4:
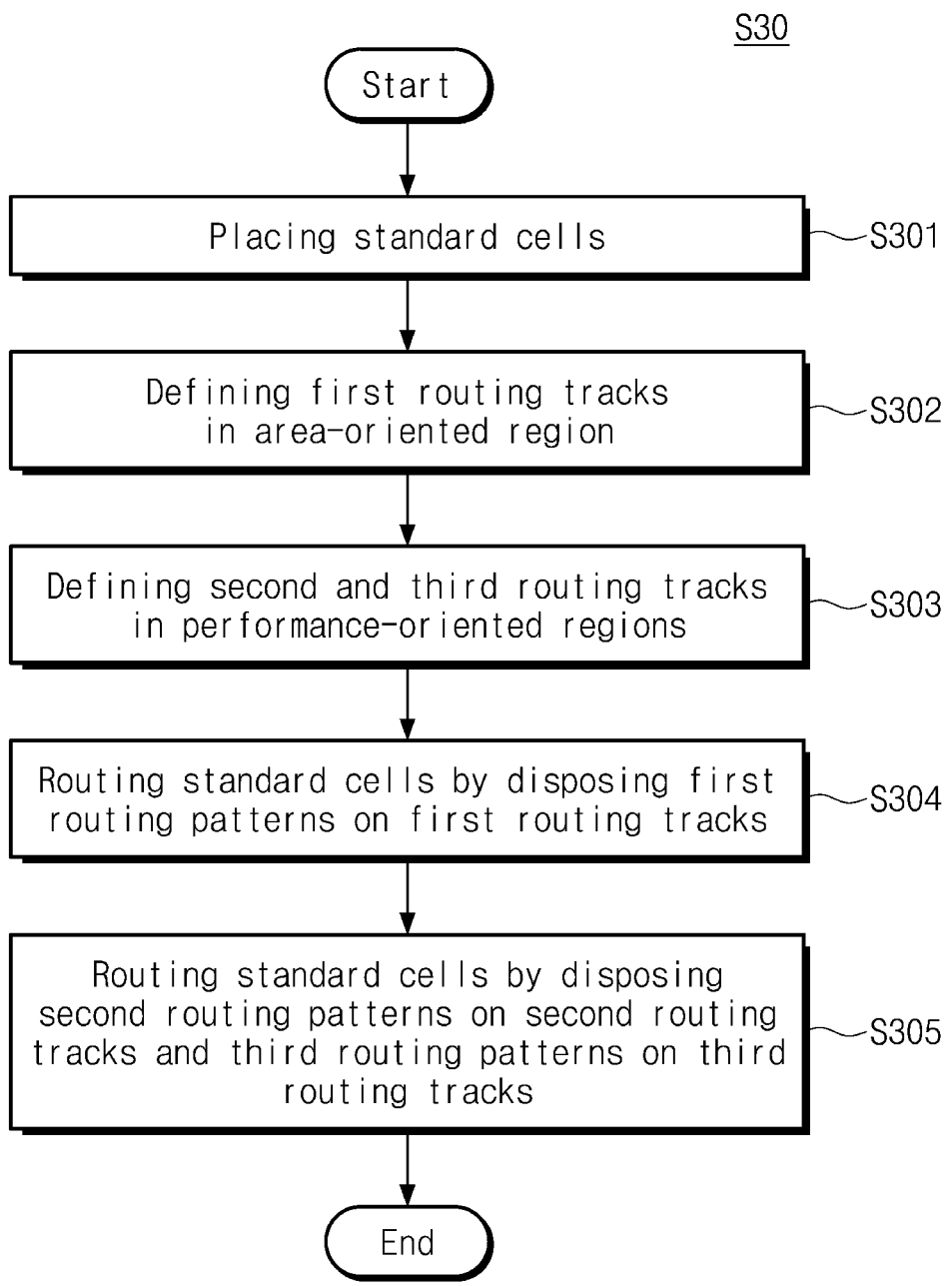
FIG. 4 is a flow chart illustrating a step of placing and routing standard cells of FIG. 3.
Figure 5:
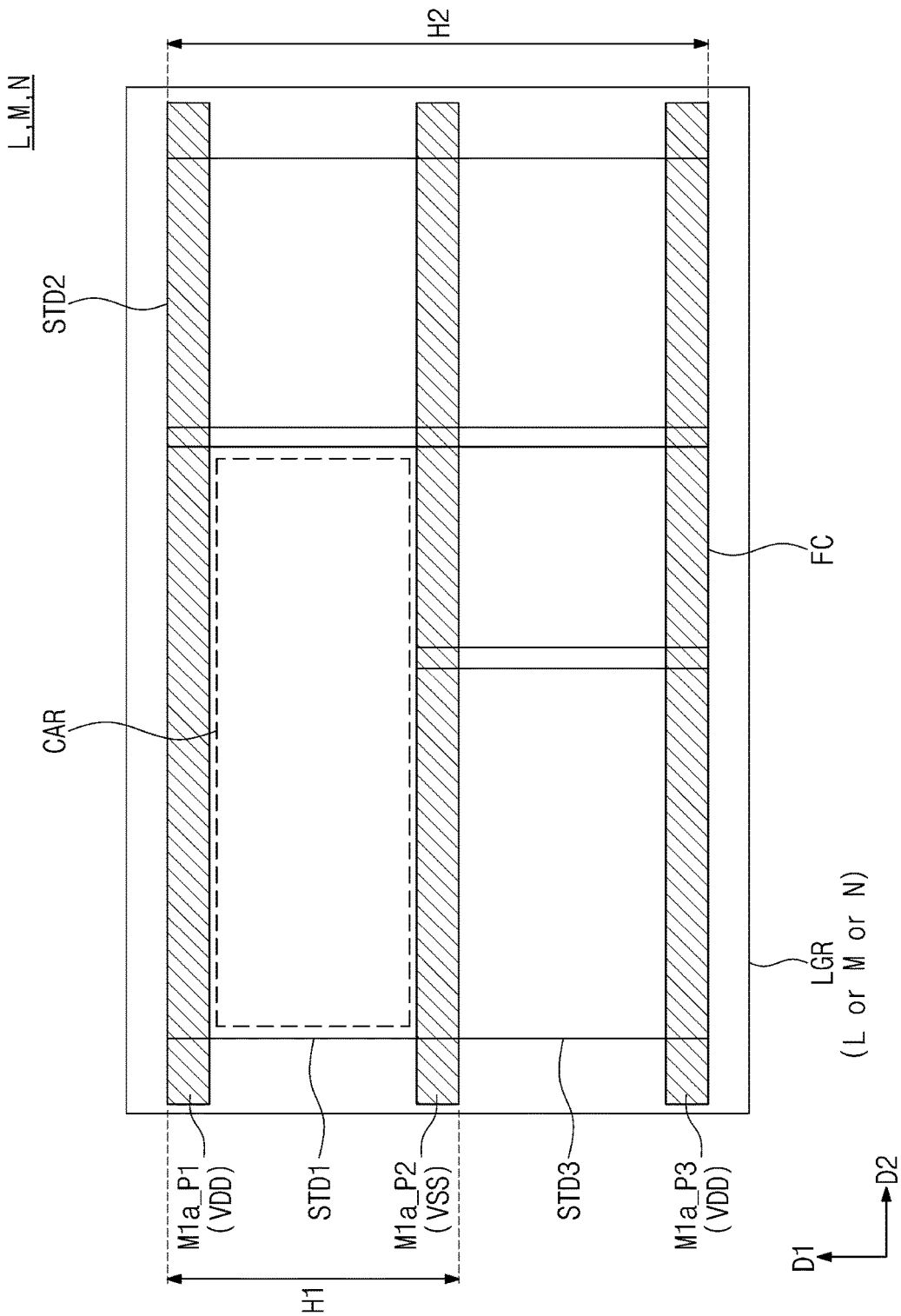
FIG. 5 is a layout plan view illustrating placing standard cells in first to third regions, respectively, of FIG. 1.
Figure 6A:
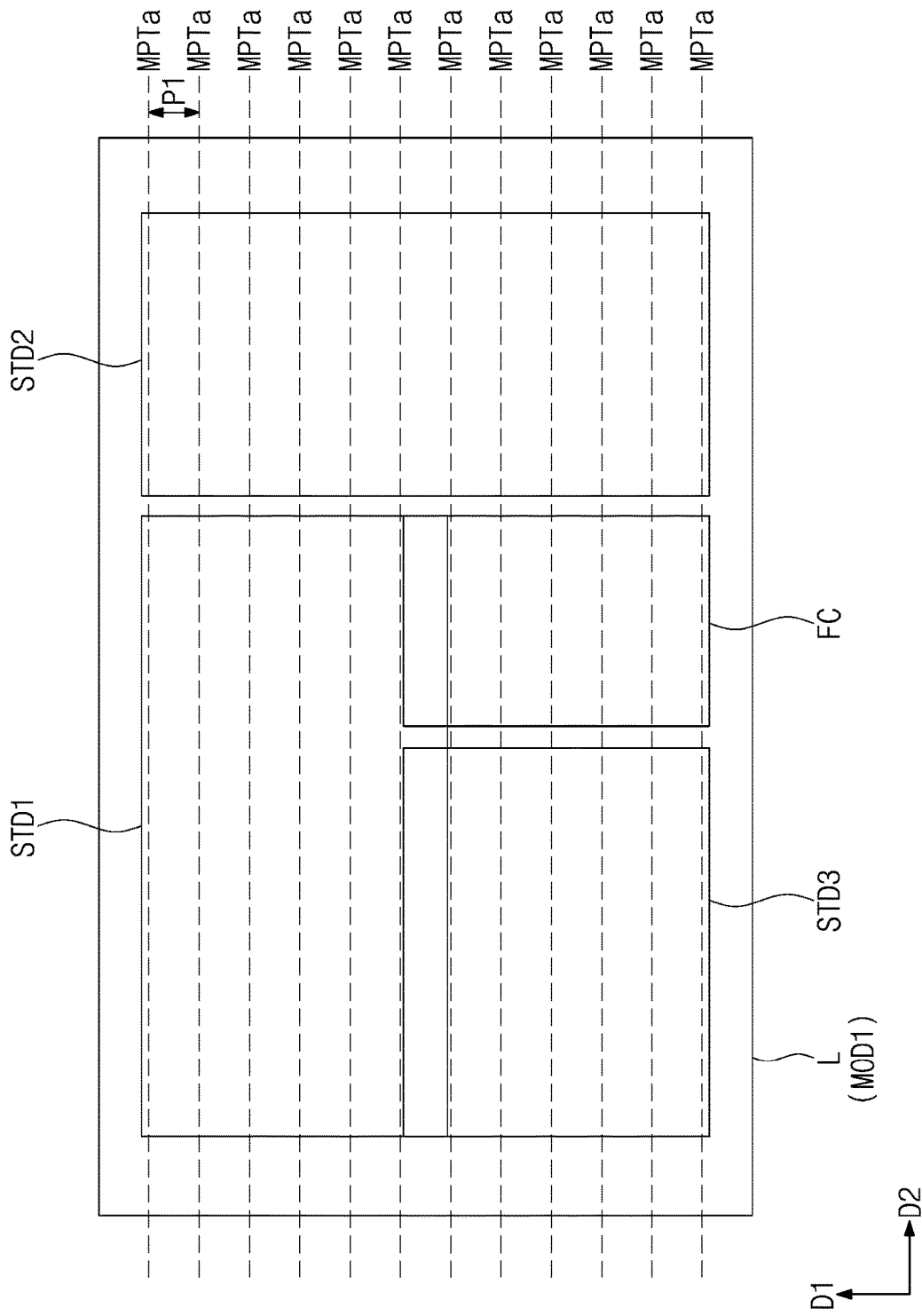
Figure 6B:
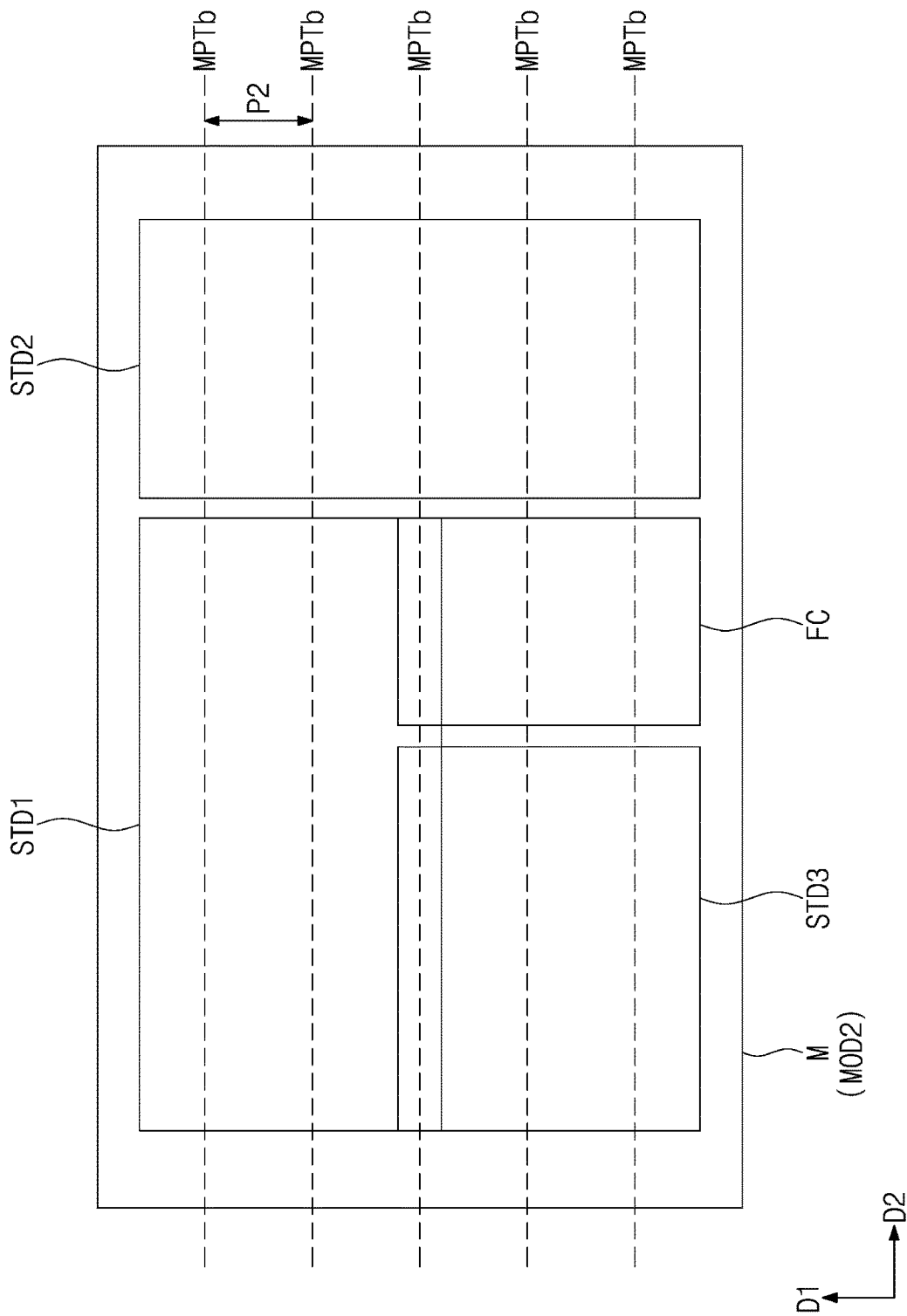
FIGS. 6B and 7B are layout plan views illustrating how to perform a routing operation on a second region.
Figure 6C:
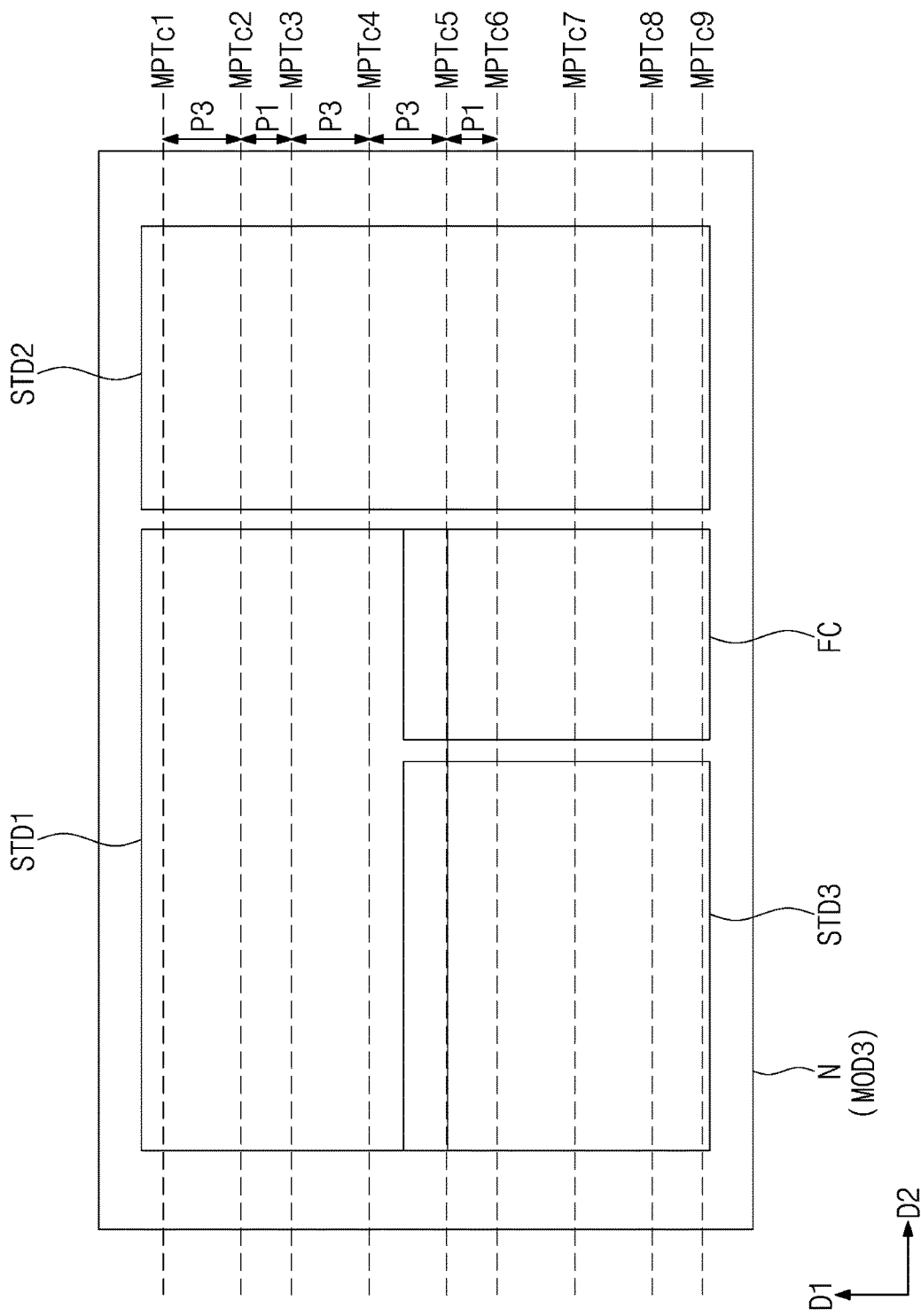
FIGS. 6C and 7C are layout plan views illustrating how to perform a routing operation on a third region.
Figure 7B:
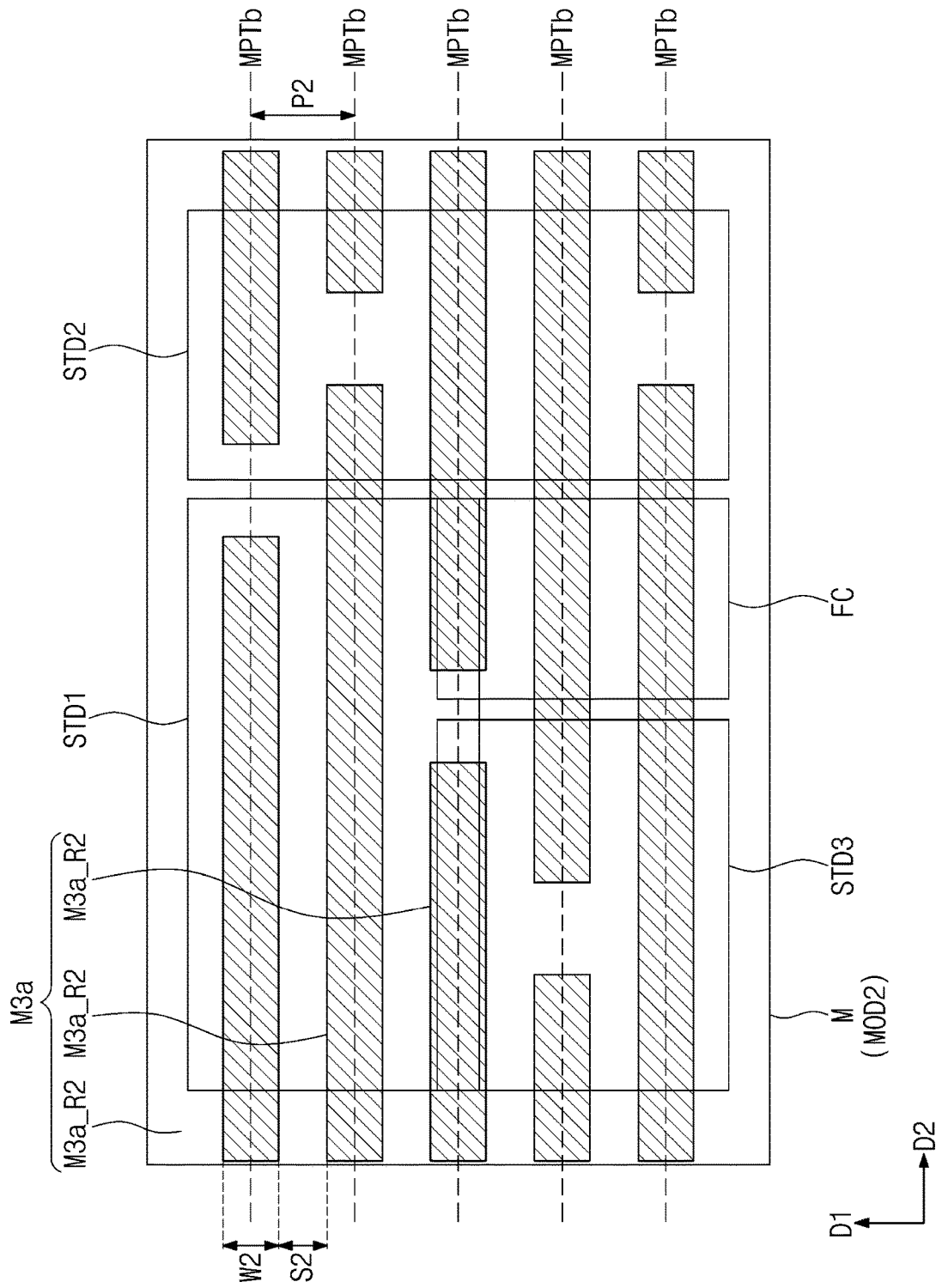
Figure 7C:
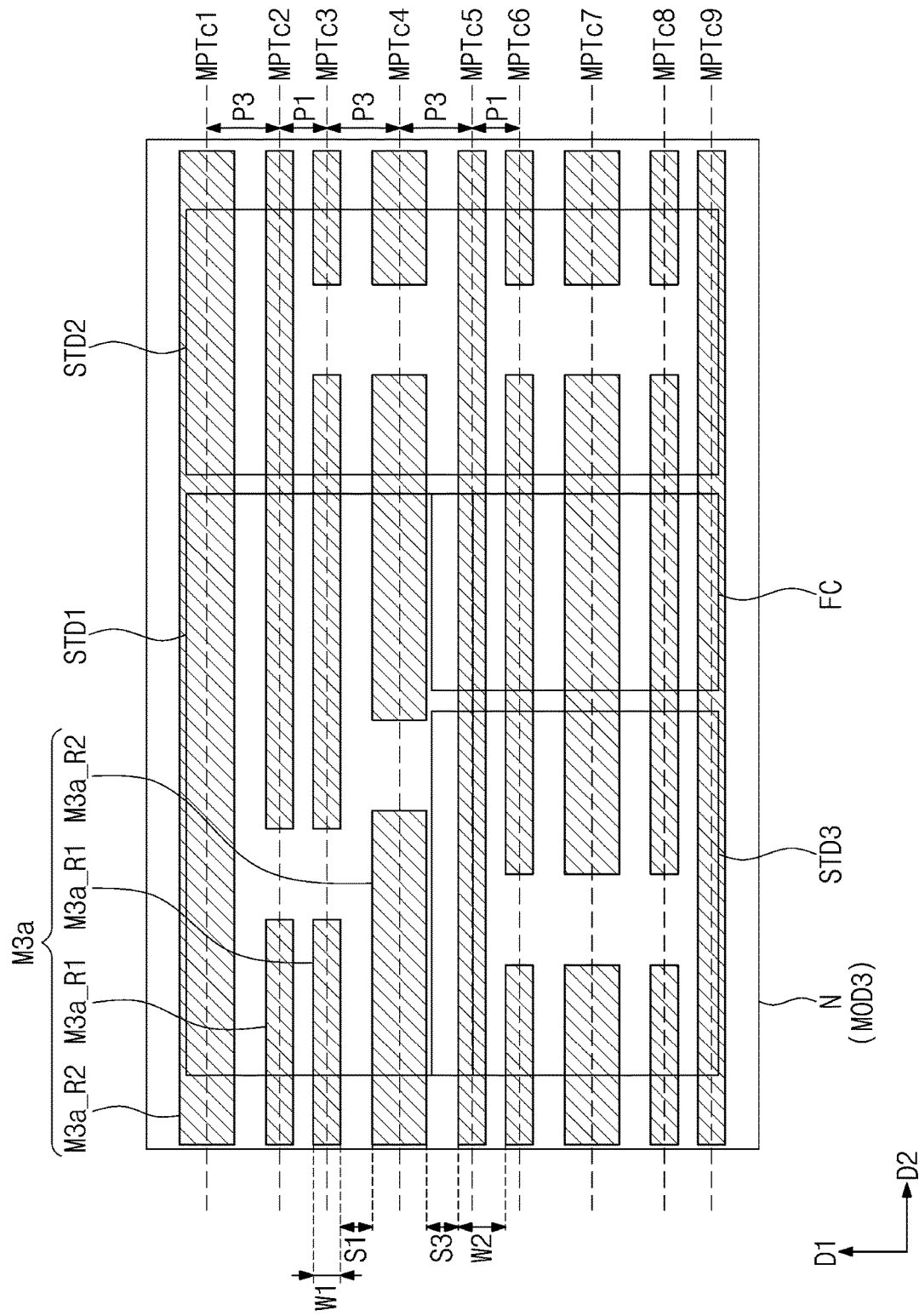

FIG. 4 is a flow chart in detail illustrating a step S30 of placing and routing standard cells of FIG. 3. FIG. 5 is a layout plan view illustrating placing standard cells in first to third regions L, M, and N, respectively, of FIG. 1. FIGS. 6A and 7A are layout plan views illustrating how to perform a routing operation on the first region L. FIGS. 6B and 7B are layout plan views illustrating how to perform a routing operation on the second region M. FIGS. 6C and 7C are layout plan views illustrating how to perform a routing operation on the third region N.

Referring to FIGS. 1, 4, and 5, standard cells, which are designed through the layout design step S20, may be prepared. The standard cells may be placed or disposed in each of the modules MOD1-MOD5 of FIG. 1 (in S301). For example, each of the modules MOD1-MOD5 may include a logic region, in which the standard cells are disposed.

For example, the standard cells may be two-dimensionally disposed in each of the first region L of the first module MOD1, the second region M of the second module MOD2, and the third region N of the third module MOD3. Each of the first region L, the second region M, and the third module MOD3 may be a logic region LGR of the corresponding module. The logic region LGR may comprise logic circuits of a semiconductor logic device.

First to third standard cells STD1, STD2, and STD3 may be two-dimensionally disposed on the logic region LGR. The second standard cell STD2 may be adjacent to the first standard cell STD1 in a second direction D2. The first standard cell STD1 and the third standard cell STD3 may be adjacent to each other in a first direction D1.

A filler cell FC may be further provided on the logic region LGR. The filler cell FC may be a dummy cell, which is not used to constitute a logic circuit. The filler cell FC may be disposed on an empty space between the second standard cell STD2 and the third standard cell STD3.

A plurality of power patterns M1a_P1, M1a_P2, and M1a_P3 may be provided on the logic region LGR. The power patterns M1a_P1, M1a_P2, and M1a_P3 may include a first power pattern M1a_P1 defining an interconnection line applied with a power voltage VDD, a second power pattern M1a_P2 defining an interconnection line applied with a ground voltage VSS, and a third power pattern M1a_P3 defining an interconnection line applied with the power voltage VDD. The first to third power patterns M1a_P1, M1a_P2, and M1a_P3 may be extended lengthwise in the second direction D2 to be parallel to each other.

The first standard cell STD1 may be disposed between the first power pattern M1a_P1 and the second power pattern M1a_P2. The second standard cell STD2 may be disposed between the first power pattern M1a_P1 and the third power pattern M1a_P3. The third standard cell STD3 may be disposed between the second power pattern M1a_P2 and the third power pattern M1a_P3.

Hereinafter, a length of the standard cell of FIG. 5 measured in in the first direction D1 will be defined as a "height". The first standard cell STD1 may have a first height H1. The second standard cell STD2 may have a second height H2. The second height H2 may be greater than the first height H1. The second height H2 may be about two times the first height H1. In some embodiments, the third standard cell STD3 may have a height the same as the first height H1. Each of the first standard cell STD1 and the third standard cell STD3 may be defined as a single height standard cell having the first height H1. The second standard cell STD2 may be defined as a double height standard cell having the second height H2.

The layout of FIG. 5 illustrates only power patterns exemplarily, but first interconnection line patterns of a first metal layer layout and second interconnection line patterns of a second metal layer layout may be further disposed on the logic region LGR.

Referring to FIGS. 1, 4, and 6A, first routing tracks MPTa may be defined on the first region L, which is the area-oriented region (in S302). The first routing tracks MPTa may define disposition of routing lines of a third metal layer layout M3a. The first routing tracks MPTa may be imaginary lines that are used to dispose first routing patterns M3a_R1, which will be described below, on the first region L. The first routing tracks MPTa may be extended lengthwise in the second direction D2. The first routing tracks MPTa may be arranged in the first direction D1 with a first pitch P1. The first routing tracks MPTa may be arranged to be spaced apart from each other by a constant distance (i.e., with the first pitch P1).

Referring to FIGS. 1, 4, and 6B, second routing tracks MPTb may be defined on the second region M, which is the performance-oriented region (in S303). The second routing tracks MPTb may define disposition of routing lines of the third metal layer layout M3a. The second routing tracks MPTb may be imaginary lines that are used to dispose second routing patterns M3a_R2, which will be described below, on the second region M. The second routing tracks MPTb may be extended lengthwise in the second direction D2. The second routing tracks MPTb may be arranged in the first direction D1 with a second pitch P2. The second routing tracks MPTb may be arranged to be spaced apart from each other by a constant distance (i.e., with the second pitch P2).

The second pitch P2 may be greater than the first pitch P1. For example, the second pitch P2 may be 1.1 to 6.0 times the first pitch P1. In some embodiments, the second pitch P2 may be 1.5 to 4.0 times the first pitch P1. Since the first pitch P1 of the first routing tracks MPTa is smaller than the second pitch P2 of the second routing tracks MPTb, the number of the first routing tracks MPTa disposed on a given area may be greater than that of the second routing tracks MPTb. For example, 12 first routing tracks MPTa may be arranged on the first region L, but 5 second routing tracks MPTb may be arranged on the second region M, which has the same area as the first region L.

Referring to FIGS. 1, 4, and 6C, third routing tracks MPTc may be defined on the third region N, which is another performance-oriented region. The third routing tracks MPTc may define disposition of routing lines of the third metal layer layout M3a. The third routing tracks MPTc may be imaginary lines that are used to dispose first and second routing patterns M3a_R1 and M3a_R2, which will be described below, on the third region N. The third routing tracks MPTc may be extended lengthwise in the second direction D2.

In an example embodiment, the third routing tracks MPTc may include first to ninth tracks MPTc1-MPTc9 of the third routing tracks. They may be arranged in the first direction D1 with at least two different pitches. For example, a distance between the first and second tracks MPTc1 and MPTc2 of the third routing tracks MPTc may be a third pitch P3. A distance between the second and third tracks MPTc2 and MPTc3 of the third routing tracks MPTc may be a first pitch P1. The first pitch P1 may be substantially equal to the first pitch P1 between the first routing tracks MPTa of FIG. 6A. The third pitch P3 may be greater than the first pitch P1 and may be smaller than the second pitch P2 between the second routing tracks MPTb previously described with reference to FIG. 6B. For example, the third pitch P3 may be 1.1 to 6.0 times the first pitch P1. In some embodiments, the third pitch P3 may be 1.5 to 3.0 times the first pitch P1. As used herein, terms such as "same," "equal," "planar," or "coplanar" encompass near identicality including variations that may occur, for example, due to manufacturing processes. The term "substantially" may be used herein to emphasize this meaning, unless the context or other statements indicate otherwise.

The third routing tracks MPTc may be arranged with at least two different pitches (e.g., the first and second pitches P1 and P2). Accordingly, the number of the third routing tracks MPTc, which are arranged on the same area, may be greater than that of the second routing tracks MPTb and may be smaller than that of the first routing tracks MPTa. For example, 9 third routing tracks MPTc may be arranged on the third region N. In some embodiments, the third region N may be a compromise region, which may be different from the area- and performance-oriented regions (e.g., the first and second regions L and M). For example, the third region N may be a hybrid of the area-oriented and performance-oriented regions, and may include features of both the area-oriented and performance-oriented regions.

Referring to FIGS. 1, 4, and 7A, a step of routing the standard cells may be performed on the first region L of the first module MOD1. The step of routing the standard cells may include disposing first routing patterns M3a_R1 on the first routing tracks MPTa (in S304). As a result of the disposition of the first routing patterns M3a_R1, the standard cells of the first module MOD1 may be connected to each other in accordance with a desired circuit design.

The first routing patterns M3a_R1 may be aligned on the first routing tracks MPTa, respectively. For example, each of the first routing patterns M3a_R1 may be centered along the first routing tracks MPTa. Thus, the first routing patterns M3a_R1 may be arranged in the first direction D1 with the first pitch P1. The first routing patterns M3a_R1 may be extended lengthwise in the second direction D2 to be parallel to each other. In an example embodiment, the pitch of the patterns may mean a distance between center lines of two patterns that are adjacent to each other.

A line width of each of the first routing patterns M3a_R1 may be a first width W1. The first width W1 may be the smallest line width, which is defined by a design rule for the third metal layer layout M3a of the first region L.

Adjacent ones of the first routing patterns M3a_R1 may be spaced apart from each other in the first direction D1 by the smallest space of a first space S1. The first space S1 may be the smallest space defined by the design rule for the third metal layer layout M3a of the first region L. A sum of the first width W1 and the first space S1 may be substantially equal to the first pitch P1.

Referring to FIGS. 1, 4, and 7B, a step of routing the standard cells may be performed on the second region M of the second module MOD2. The step of routing the standard cells may include disposing second routing patterns M3a_R2 on the second routing tracks MPTb (in S305). As a result of the disposition of the second routing patterns M3a_R2, the standard cells of the second module MOD2 may be connected to each other in accordance with a desired circuit design.

The second routing patterns M3a_R2 may be aligned on the second routing tracks MPTb, respectively. For example, each of the second routing patterns M3a_R2 may be centered along the second routing tracks MPTb. Thus, the second routing patterns M3a_R2 may be arranged in the first direction D1 with the second pitch P2. The second routing patterns M3a_R2 may be extended lengthwise in the second direction D2 to be parallel to each other.

A line width of each of the second routing patterns M3a_R2 may be a second width W2. The second width W2 may be the smallest line width defined by a design rule for the third metal layer layout M3a of the second region M.

Adjacent ones of the second routing patterns M3a_R2 may be spaced apart from each other in the first direction D1 by the smallest space of a second space S2. The second space S2 may be the smallest space defined by the design rule for the third metal layer layout M3a of the second region M. A sum of the second width W2 and the second space S2 may be substantially equal to the second pitch P2.

The second width W2 may be greater than the first width W1 of FIG. 7A. For example, the second width W2 may be 1.1 to 3.0 times the first width W1. The second space S2 may be greater than the first space S1 of FIG. 7A. For example, the second space S2 may be 1.0 to 3.0 times the first space S1.

The second routing patterns M3a_R2 having a large line width may be disposed on the second region M, which is one of the performance-oriented regions. By contrast, the first routing patterns M3a_R1 having a small line width may be disposed on the first region L, which is one of the area-oriented regions.

Since the second routing patterns M3a_R2 are provided to have a large line width and a large pitch, the number of the second routing patterns M3a_R2 disposed on the second region M may be smaller than the number of the first routing patterns M3a_R1 disposed on the first region L. For example, a pattern density of the second routing patterns M3a_R2 on the second region M may be lower than a pattern density of the first routing patterns M3a_R1 on the first region L.

According to an example embodiment of the inventive concept, by disposing the second routing patterns M3a_R2, which have the large line width and the low pattern density, on the second region M that is the performance-oriented region, it may be possible to reduce electric resistance and parasitic capacitance between the interconnection lines. Accordingly, it may be possible to improve an operation speed (i.e., performance) of the second module MOD2.

According to an example embodiment of the inventive concept, by disposing the first routing patterns M3a_R1, which have the small line width and the high pattern density, on the first region L that is the area-oriented region, it may be possible to increase the integration density of the first module MOD1. The increase in the integration density of the first module MOD1 may lead to a reduction in an area for the first module MOD1, and this may make it possible to reduce an area of the semiconductor chip SOC.

Referring to FIGS. 1, 4, and 7C, a step of routing the standard cells may be performed on the third region N of the third module MOD3. The routing of the standard cells may include disposing first and second routing patterns M3a_R1 and M3a_R2 on the third routing tracks MPTc. As a result of the disposing of the first and second routing patterns M3a_R1 and M3a_R2, the standard cells of the third module MOD3 may be connected to each other in accordance with a desired circuit design.

The first and second routing patterns M3a_R1 and M3a_R2 may be aligned on the third routing tracks MPTc, respectively. For example, each of the first and second routing patterns M3a_R1 and M3a_R2 may be centered along the third routing tracks MPTc. The second routing pattern M3a_R2 may be disposed on the first one MPTc1 of the third routing tracks. The first routing patterns M3a_R1 may be disposed on the second and third ones MPTc2 and MPTc3 of the third routing tracks, respectively.

The first routing pattern M3a_R1 and the second routing pattern M3a_R2, which are adjacent to each other, may have the third pitch P3. Adjacent ones of the first routing patterns M3a_R1 may have the first pitch P1. As a result, the first and second routing patterns M3a_R1 and M3a_R2 on the third region N may be arranged in the first direction D1 with at least two different pitches.

A line width of each of the first routing patterns M3a_R1 may be the first width W1. A line width of each of the second routing patterns M3a_R2 may be the second width W2. Adjacent ones of the first routing patterns M3a_R1 may be spaced apart from each other in the first direction D1 by the smallest space of the first space S1. The first routing pattern M3a_R1 and the second routing pattern M3a_R2, which are adjacent to each other, may be spaced apart from each other in the first direction D1 by the smallest space of a third space S3. The third space S3 may be smaller than the second space S2 previously described with reference to FIG. 7B. For example, the third space S3 may be 1.0 to 3.0 times the first space S1.

According to an example embodiment of the inventive concept, by disposing the second routing patterns M3a_R2, which have the large line width, on the third region N that is the performance-oriented region, it may be possible to increase an operation speed of the third module MOD3. Also, by disposing the first routing patterns M3a_R1, which have the small line width, on the third region N, it may be possible to increase an integration density of the third module MOD3. For example, the third region N may be a compromise region, which is different from the area- and performance-oriented regions (e.g., the first and second regions L and M). For example, the third region N may be a hybrid of the area-oriented region and the performance-oriented region, and may include features of both the area-oriented region and the performance-oriented region.

On the third region N, at least one of the first routing patterns M3a_R1 may be disposed between a pair of the second routing patterns M3a_R2, which are adjacent to each other. This disposition structure may be periodically repeated.

For instance, FIG. 7C illustrates an example, in which a pair of the first routing patterns M3a_R1 are disposed between the adjacent pair of the second routing patterns M3a_R2. However, the inventive concept is not limited to this example. For example, although not shown, 1 to 10 first routing patterns M3a_R1 may be disposed between the adjacent pair of the second routing patterns M3a_R2.

In the routing step according to an example embodiment of the inventive concept, routing patterns with a small width and a small pitch may be disposed in the area-oriented module (i.e., on the area-oriented region), and routing patterns with a large width and a large pitch may be disposed in the performance-oriented module (i.e., on the performance-oriented region). So far, the routing of the third metal layer layout M3a has been exemplarily described with reference to FIGS. 4 to 7C. However, the inventive concept is not limited to this example. The afore-described routing may be applied to any metal layer provided with routing lines. For example, the afore-described routing method and the resultant interconnection structure may be applied to routing for high-level metal layers including the third metal layer.

Figure 8:
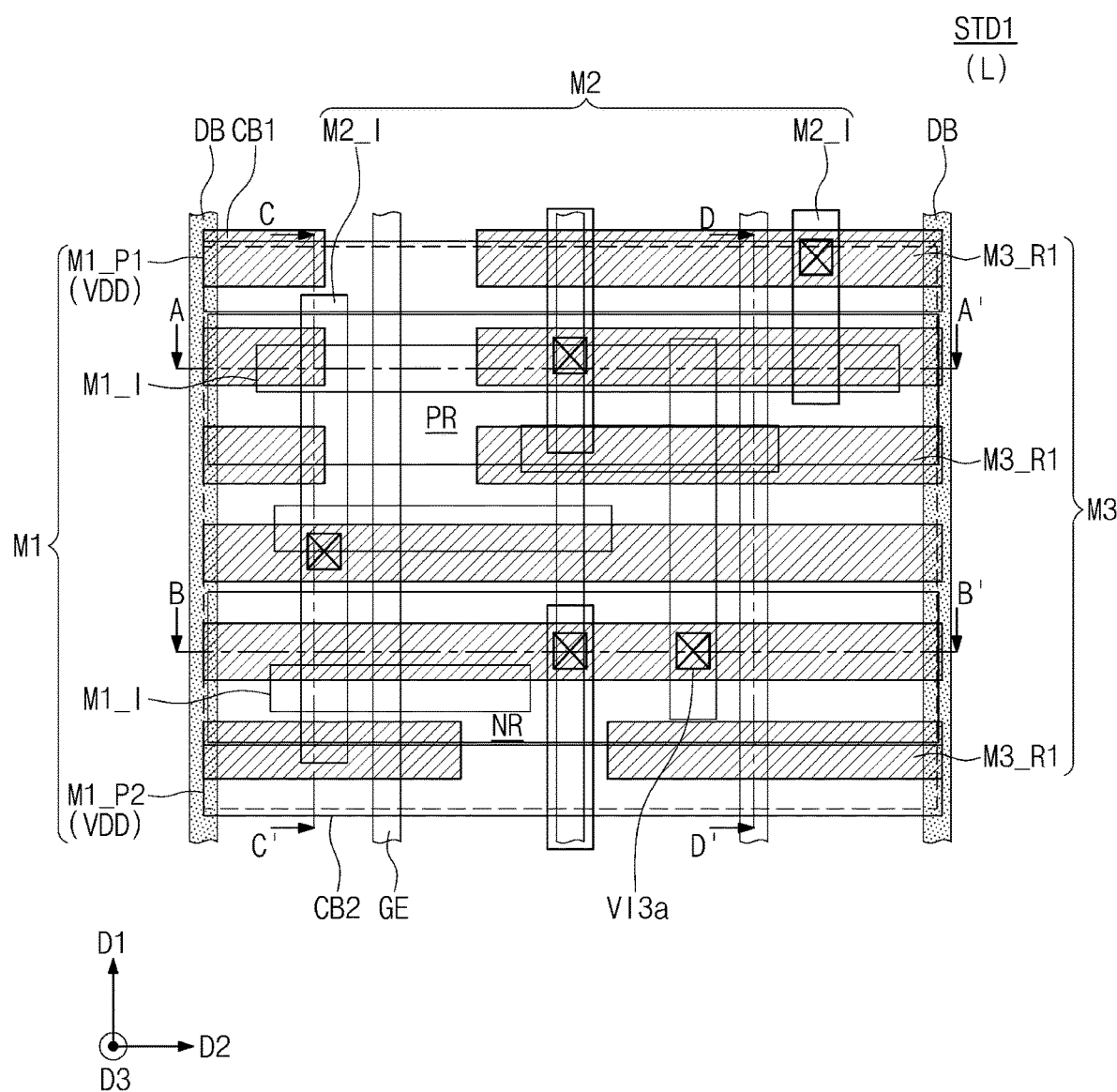
FIG. 8 is a plan view illustrating a portion (e.g., a first standard cell in a first region) of a semiconductor device, according to an example embodiment of the inventive concept.

FIG. 8 is a plan view illustrating a portion (e.g., a first standard cell in a first region) of a semiconductor device according to an example embodiment of the inventive concept. FIGS. 9A to 9D are sectional views which are respectively taken along lines A-A', B-B', C-C', and D-D' of FIG. 8. The semiconductor device of FIGS. 8 and 9A to 9D may be an example of the first standard cell STD1 of the first region L of the first module MOD1, which is actually realized on a substrate using the layout of FIG. 7A.

Referring to FIGS. 1, 8, and 9A to 9D, the first standard cell STD1, which is one of logic cells, may be provided on the first module MOD1, which is one of the area-oriented modules. Logic transistors constituting the logic circuit may be disposed on the first standard cell STD1.

A substrate 100 may include a first active region PR and a second active region NR. In an example embodiment, the first active region PR may be a PMOSFET region, and the second active region NR may be an NMOSFET region. The substrate 100 may be a semiconductor substrate, which is formed of or includes silicon, germanium, silicon-germanium, or the like, or a compound semiconductor substrate. As an example, the substrate 100 may be a silicon wafer.

Figure 9A:
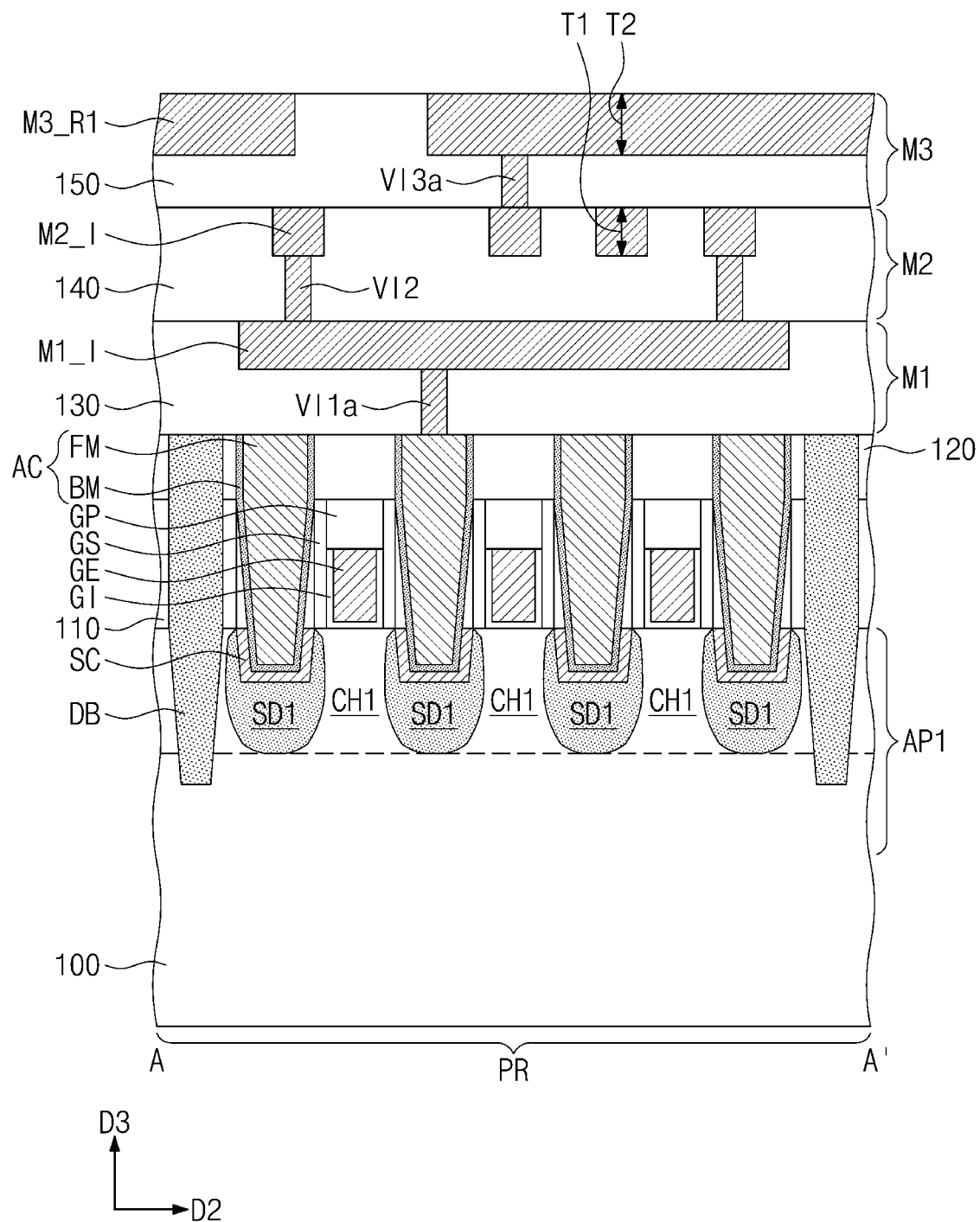
FIGS. 9A to 9D are sectional views which are respectively taken along lines A-A', B-B', C-C' and D-D' of FIG. 8.
Figure 9B:
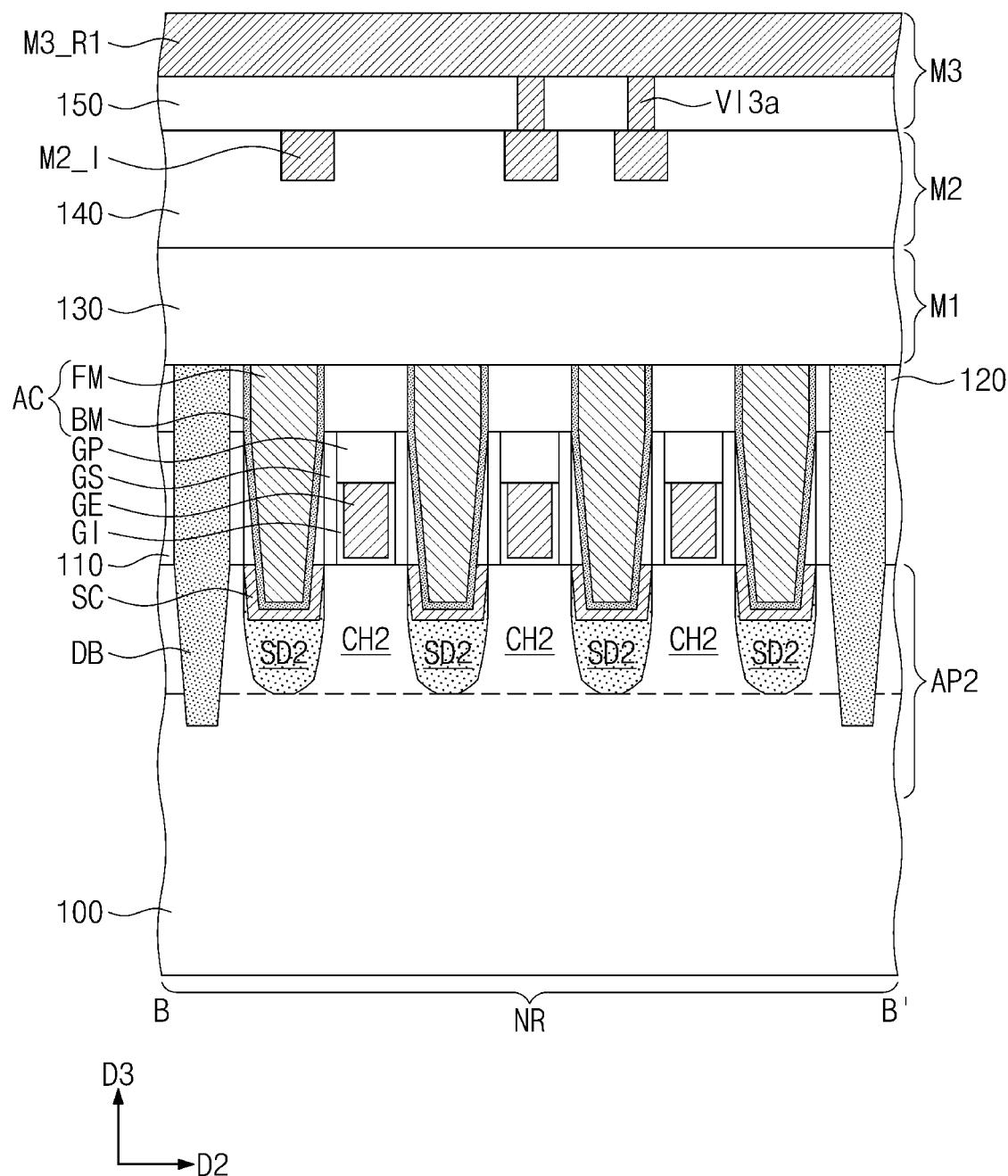
Figure 9C:
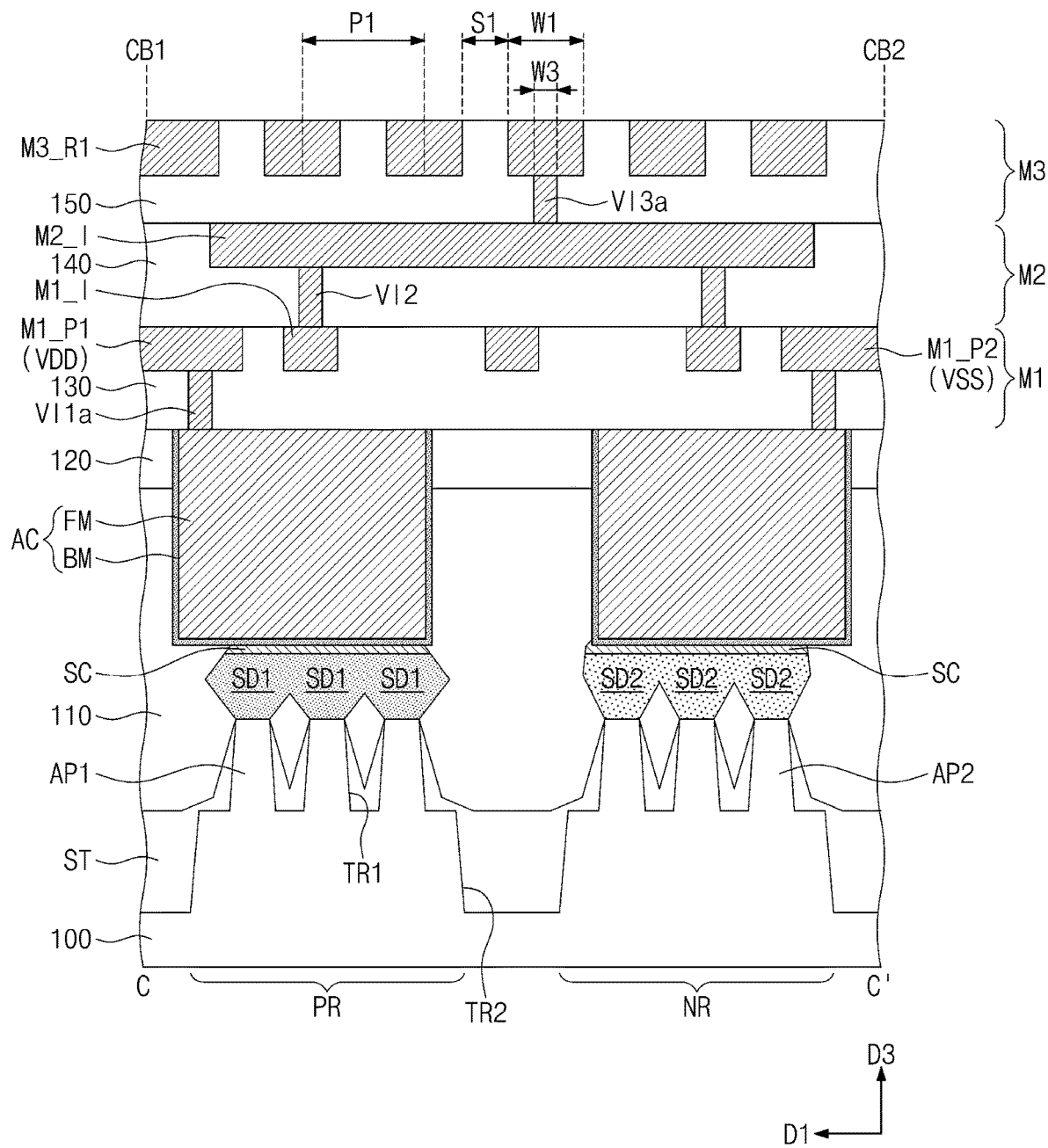
Figure 9D:
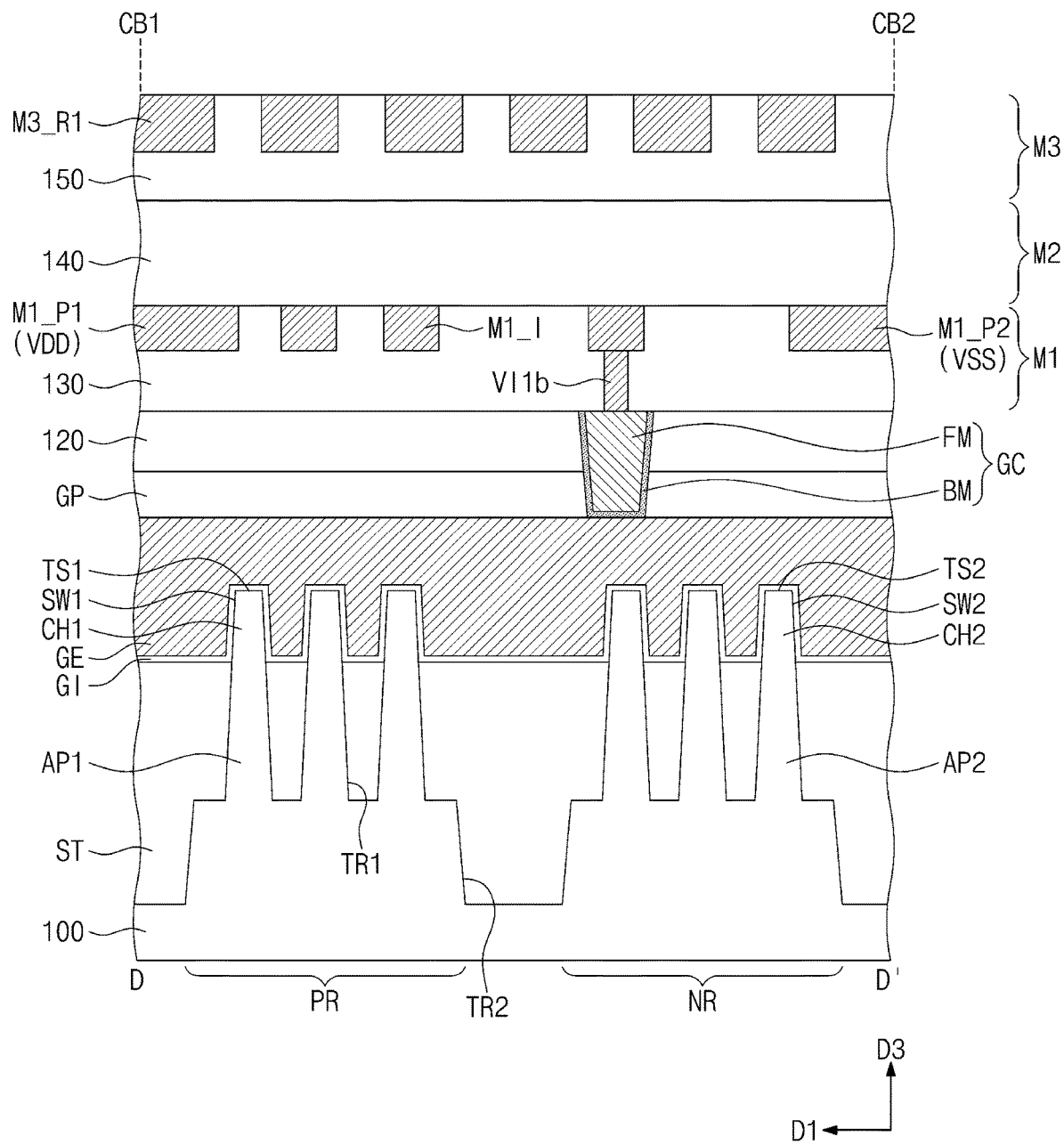

The first and second active regions PR and NR may be defined by a second trench TR2, which is formed in an upper portion of the substrate 100 (e.g., see FIGS. 9C and 9D). The second trench TR2 may be located between the first and second active regions PR and NR. The first and second active regions PR and NR may be spaced apart from each other in the first direction D1 with the second trench TR2 interposed therebetween. Each of the first and second active regions PR and NR may be extended lengthwise in a second direction D2 that is different from the first direction D1.

First active patterns AP1 and second active patterns AP2 may be provided on the first active region PR and the second active region NR, respectively. The first and second active patterns AP1 and AP2 may be extended lengthwise in the second direction D2 to be parallel to each other. The first and second active patterns AP1 and AP2 may be portions of the substrate 100, which have a vertically protruding shape that protrudes above an upper surface of the substrate 100. A first trench TR1 may be defined between adjacent ones of the first active patterns AP1 and between adjacent ones of the second active patterns AP2. The first trench TR1 may be shallower than the second trench TR2.

A device isolation layer ST may be provided to fill the first and second trenches TR1 and TR2. The device isolation layer ST may include a silicon oxide layer. Upper portions of the first and second active patterns AP1 and AP2 may have a shape vertically protruding above the device isolation layer ST (e.g., see FIG. 9D). Each of the upper portions of the first and second active patterns AP1 and AP2 may have a fin shape. The device isolation layer ST may not cover the upper portions of the first and second active patterns AP1 and AP2. The device isolation layer ST may cover lower side surfaces of the first and second active patterns AP1 and AP2.

First source/drain patterns SD1 may be provided in the upper portions of the first active patterns AP1. The first source/drain patterns SD1 may be impurity regions of a first conductivity type (e.g., p-type). A first channel pattern CH1 may be interposed between a pair of the first source/drain patterns SD1. For example, each first channel pattern CH1 may contact the pair of the first source/drain patterns SD1 that are adjacent on either side of the first channel pattern CH1. Second source/drain patterns SD2 may be provided in the upper portions of the second active patterns AP2. The second source/drain patterns SD2 may be impurity regions of a second conductivity type (e.g., n-type). A second channel pattern CH2 may be interposed between each pair of the second source/drain patterns SD2. For example, each second channel pattern CH2 may contact the pair of the second source/drain patterns SD2 that are adjacent on either side of the second channel pattern CH2.

The first and second source/drain patterns SD1 and SD2 may be epitaxial patterns that are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher in the third direction D3 than the top surfaces of the first and second channel patterns CH1 and CH2.

The first source/drain patterns SD1 may include a semiconductor material (e.g., SiGe), which has a larger lattice constant than a semiconductor material in the substrate 100. Accordingly, the first source/drain patterns SD1 may exert a compressive stress on the first channel patterns CH1. In an example embodiment, the second source/drain patterns SD2 may include the same semiconductor material (e.g., S1) as the substrate 100.

Gate electrodes GE may be provided to cross the first and second active patterns AP1 and AP2 and to extend lengthwise in the first direction D1. The gate electrodes GE may be arranged in parallel with one another in the second direction D2 with a constant pitch. The gate electrodes GE may be overlapped with the first and second channel patterns CH1 and CH2, when viewed in a plan view. Each of the gate electrodes GE may be provided to face a top surface and both side surfaces of each of the first and second channel patterns CH1 and CH2. In the first active region PR, each of the gate electrodes GE may be provided between a pair of first source/drain patterns SD1 such that a first source/drain pattern SD1 is provided on either side of the gate electrode GE, when viewed in plan view. For example, a first source/drain pattern SD1 may be provided on the first active pattern AP1 and to the side of a gate electrode GE. In the second active region NR, each of the gate electrodes GE may be provided between a pair of second source/drain patterns SD2 such that a second source/drain pattern SD2 is provided on either side of the gate electrode GE, when viewed in plan view. For example, a second source/drain pattern SD2 may be provided on the second active pattern AP2 and to the side of a gate electrode GE.

Referring back to FIG. 9D, the gate electrode GE may be provided to face a first top surface TS1 of the first channel pattern CH1 and at least one of first side surfaces SW1 of the first channel pattern CH1. The gate electrode GE may be provided to face a second top surface TS2 of the second channel pattern CH2 and at least one of second side surfaces SW2 of the second channel pattern CH2. For example, the transistor according to the present embodiment may be a three-dimensional field effect transistor (e.g., FinFET), in which the gate electrode GE is disposed to three-dimensionally surround the first and second channel patterns CH1 and CH2.

Referring back to FIGS. 8 and 9A to 9D, a pair of gate spacers GS may be disposed on opposite side surfaces of each of the gate electrodes GE. The gate spacers GS may be extended lengthwise along the gate electrodes GE and in the first direction D1. Top surfaces of the gate spacers GS may be higher in the third direction D3 than those of the gate electrodes GE. Bottom surfaces of the gate spacers GS may contact top surfaces of the first and second channel patterns CH1 and CH2, respectively. The top surfaces of the gate spacers GS may be coplanar with a top surface of a first interlayer insulating layer 110, which will be described below. The gate spacers GS may be formed of or may include at least one of SiCN, SiCON, or SiN. Alternatively, the gate spacers GS may include a multi-layer that is made of at least two of SiCN, SiCON, or SiN.

A gate capping pattern GP may be provided on each of the gate electrodes GE. The gate capping pattern GP may be extended along the gate electrode GE and in the first direction D1. The top surfaces of the gate capping pattern GP may be coplanar with the top surfaces of the gate spacers GS. The gate capping pattern GP may include at least one of materials having an etch selectivity with respect to first and second interlayer insulating layers 110 and 120, which will be described below. In detail, the gate capping patterns GP may be formed of or include at least one of SiON, SiCN, SiCON, or SiN.

A gate dielectric pattern GI may be interposed between the gate electrode GE and the first active pattern AP1 and between the gate electrode GE and the second active pattern AP2. The gate dielectric pattern GI may be extended along a bottom surface of the gate electrode GE thereon. As an example, the gate dielectric pattern GI may cover the first top surface TS1 and the first side surface SW1 of the first channel pattern CH1. The gate dielectric pattern GI may cover the second top surface TS2 and both of the second side surfaces SW2 of the second channel pattern CH2. In some embodiments, the gate dielectric pattern GI may contact the first top surface TS1 and the first side surface SW1 of the first channel pattern CH1 and the second top surface TS2 and both of the second side surfaces SW2 of the second channel pattern CH2. The gate dielectric pattern GI may cover a top surface of the device isolation layer ST provided below the gate electrode GE (e.g., see FIG. 9D). In some embodiments, the gate dielectric pattern GI may contact the top surface of the device isolation layer ST.

In an embodiment, the gate dielectric pattern GI may be formed of or may include a high-k dielectric material, whose dielectric constant is greater than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may include a first metal pattern and a second metal pattern on the first metal pattern. The first metal pattern may be provided on the gate dielectric pattern GI and may be adjacent to the first and second channel patterns CH1 and CH2. The first metal pattern may include a work function metal, which can be used to adjust a threshold voltage of the transistor. By adjusting a thickness and composition of the first metal pattern, it may be possible to realize a transistor having a desired threshold voltage.

The first metal pattern may include a metal nitride layer. For example, the first metal pattern may include at least one metal, which is selected from the group consisting of titanium (Ti), tantalum (Ta), aluminum (Al), tungsten (W) and molybdenum (Mo), and nitrogen (N). The first metal pattern may further include carbon (C). The first metal pattern may include a plurality of work function metal layers, which are sequentially stacked.

The second metal pattern may include a metallic material, whose resistance is lower than the first metal pattern. For example, the second metal pattern may include at least one metal selected from the group consisting of tungsten (W), aluminum (Al), titanium (Ti), and tantalum (Ta).

A first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with top surfaces of the gate capping patterns GP and the top surfaces of the gate spacers GS. A second interlayer insulating layer 120 may be provided on the first interlayer insulating layer 110 to cover the gate capping patterns GP. A third interlayer insulating layer 130, a fourth interlayer insulating layer 140, and a fifth interlayer insulating layer 150 may be sequentially provided on the second interlayer insulating layer 120. A bottom surface of the second interlayer insulating layer 120 may contact a top surface of the first interlayer insulating layer 110, a bottom surface of the third interlayer insulating layer 130 may contact a top surface of the second interlayer insulating layer 120, a bottom surface of the fourth interlayer insulating layer 140 may contact a top surface of the third interlayer insulating layer 130, and a bottom surface of the fifth interlayer insulating layer 150 may contact a top surface of the fourth interlayer insulating layer 140. As an example, each or at least one of the first to fifth interlayer insulating layers 110-150 may be formed of or may include silicon oxide.

A pair of isolation structures DB may be provided at opposite sides of the first standard cell STD1 to be opposite to each other in the second direction D2. The isolation structure DB may be extended lengthwise in the first direction D1 and may be parallel to the gate electrodes GE. Top surfaces of the pair of isolation structures DB may be coplanar with the top surface of the second interlayer insulating layer 120, and the bottom surface of the third interlayer insulating layer 130 may contact the top surfaces of the pair of isolation structures DB.

The isolation structures DB may be provided to penetrate the first and second interlayer insulating layers 110 and 120 and may be extended into the first and second active patterns AP1 and AP2. The isolation structures DB may penetrate the upper portion of each of the first and second active patterns AP1 and AP2. For example, bottom surfaces of the isolation structures DB may be at a lower height than upper surfaces of the first and second active patterns AP1 and AP2. The isolation structures DB may isolate the first and second active regions PR and NR of the first standard cell STD1 from neighboring active regions of the logic cell.

Active contacts AC may be provided to penetrate the first and second interlayer insulating layers 110 and 120 and may be electrically connected to the first and second source/drain patterns SD1 and SD2, respectively. Each of the active contacts AC may be provided between a pair of the gate electrodes GE. In some embodiments, an active contact AC may be between a gate electrode GE and an adjacent isolation structure DB.

The active contact AC may be a self-aligned contact. For example, the active contact AC may be formed by a self-alignment process using the gate capping pattern GP and the gate spacer GS. In an embodiment, the active contact AC may cover at least a portion of a side surface of the gate spacer GS. Although not shown, the active contact AC may cover a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected to the source/drain pattern SD1 and SD2 through the silicide pattern SC. Top surfaces of the silicide patterns SC may be coplanar with the top surfaces of the first and second channel active patterns CH1 and CH2, and a bottom surface of first interlayer insulating layer 110 may contact the top surfaces of the silicide patterns SC. The silicide pattern SC may be formed of or may include at least one of metal-silicides (e.g., titanium-silicide, tantalum-silicide, tungsten-silicide, nickel-silicide, and cobalt-silicide).

A gate contact GC may be provided to penetrate the second interlayer insulating layer 120 and the gate capping pattern GP and may be electrically connected to the gate electrode GE. A top surface of the gate contact GC may be coplanar with the top surface of the second interlayer insulating layer 120, and a bottom surface of the gate contact GC may be coplanar with a bottom surface of the gate capping pattern GP.

Each of the active and gate contacts AC and GC may include a conductive pattern FM and a barrier pattern BM enclosing the conductive pattern FM. The conductive pattern FM may be formed of or may include at least one of metallic materials (e.g., aluminum, copper, tungsten, molybdenum, or cobalt). The barrier pattern BM may cover side and bottom surfaces of the conductive pattern FM. The barrier pattern BM may include at least one of a metal layer and/or a metal nitride layer. The metal layer may be formed of or include at least one of titanium, tantalum, tungsten, nickel, cobalt, or platinum. The metal nitride layer may include at least one of a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer. The second interlayer insulating layer 120 and the gate capping pattern GP may contact side surfaces of the barrier pattern BM of the gate contact GC, and the first and second interlayer insulating layers 110 and 120 may contact side surfaces of the barrier pattern BM of the active contact.

A first metal layer M1 may be provided in the third interlayer insulating layer 130. The first metal layer M1 may include a first power line M1_P1, a second power line M1_P2, and first interconnection lines M1_I.

Each of the first and second power lines M1_P1 and M1_P2 may be extended lengthwise in the second direction D2 to cross the first standard cell STD1. In detail, a first cell boundary CB1 extending in the second direction D2 may be defined in the first standard cell STD1. In the first standard cell STD1, a second cell boundary CB2 may be defined at an opposite side of the first cell boundary CB1. The first power line M1_P1 may be disposed on the first cell boundary CB1. The first power line M1_P1 may be extended along the first cell boundary CB1 or in the second direction D2. The second power line M1_P2 may be disposed on the second cell boundary CB2. The second power line M1_P2 may be extended lengthwise along the second cell boundary CB2 or in the second direction D2.

The first interconnection lines M1_I may be disposed between the first and second power lines M1_P1 and M1_P2. Each of the first interconnection lines M1_I may be a line- or bar-shaped pattern extending lengthwise in the second direction D2. The first interconnection lines M1_I may be arranged in the first direction D1 with a constant pitch.

The first metal layer M1 may further include first lower vias VI1a and second lower vias VI1b. The first lower vias VI1a may be interposed between the active contact AC and the interconnection line of the first metal layer M1 to electrically connect them to each other. The second lower vias VI1b may be interposed between the gate contact GC and the interconnection line of the first metal layer M1 to electrically connect them to each other.

In detail, the first power line M1_P1 may be electrically connected to the active contact AC of the first active region PR through the first lower via VI1a (e.g., see FIG. 9C). The second power line M1_P2 may be electrically connected to the active contact AC of the second active region NR through the first lower via VI1a (e.g., see FIG. 9C). The first interconnection line M1_I may be electrically connected to the active contact AC through the first lower via VI1a (e.g., see FIG. 9A). The first interconnection line M1_I may be electrically connected to the gate contact GC through the second lower via VI1b (e.g., see FIG. 9D).

As an example, the interconnection line and the via of the first metal layer M1 may be separately formed by different processes. For example, each of the interconnection line and the via of the first metal layer M1 may be formed by a single damascene process. The semiconductor device according to the present embodiment may be fabricated using a sub-20 nm process.

A second metal layer M2 may be provided in the fourth interlayer insulating layer 140. The second metal layer M2 may include second interconnection lines M2_I. Each of the second interconnection lines M2_I of the second metal layer M2 may be a line- or bar-shaped pattern extending in the first direction D1. For example, the second interconnection lines M2_I may be extended lengthwise in the first direction D1 to be parallel to each other. When viewed in a plan view, the second interconnection lines M2_I may be parallel to the gate electrodes GE. The second interconnection lines M2_I may be arranged in the second direction D2 with a constant pitch.

The second metal layer M2 may further include second vias VI2. The second vias VI2 may be provided below the second interconnection lines M2_I. The second interconnection lines M2_I may be electrically connected to the first interconnection lines M1_I of the first metal layer M1 through the second vias VI2.

A third metal layer M3 may be provided in the fifth interlayer insulating layer 150. The third metal layer M3 may include first routing lines M3_R1. The first routing lines M3_R1 may be structures formed using the layout of the first routing patterns M3a_R1 of FIG. 7A.

Each of the first routing lines M3_R1 may be a line- or bar-shaped pattern extending lengthwise in the second direction D2. The first routing lines M3_R1 may be arranged in the first direction D1 with the first pitch P1. A line width of each of the first routing lines M3_R1 may be the first width W1. Adjacent ones of the first routing lines M3_R1 may be spaced apart from each other in the first direction D1 by the smallest space of the first space S1.

A thickness of the first routing line M3_R1 may be greater than a thickness of the second interconnection line M2_I. For example, the second interconnection line M2_I may have a first thickness T1, and the first routing line M3_R1 may have a second thickness T2, which is greater than the first thickness T1 (e.g., see FIG. 9A). Thickness may refer to the thickness or height measured in a direction perpendicular to a top surface of the substrate 100 (e.g., the third direction D3). A line width W1 of the first routing line M3_R1 may be greater than a line width of the second interconnection line M2_I. The line width W1 of the first routing line M3_R1 may be greater than the line width of the first interconnection line M1_I.

The third metal layer M3 may further include third vias VI3a. The third vias VI3a may be provided below the first routing lines M3_R1. The first routing line M3_R1 may be electrically connected to the second interconnection line M2_I through the third via VI3a. The third via VI3a may have a third width W3 in the first direction D1. The third width W3 may be smaller than the first width W1. The third width W3 may be the smallest size of a via defined by a design rule for the third metal layer M3 on the first region L.

The interconnection lines of the first, second, and third metal layers M1, M2, and M3 may be formed of or may include the same conductive material or different conductive materials. For example, each of the interconnection lines of the first, second, and third metal layers M1, M2, and M3 may be formed of or may include at least one of metallic materials (e.g., aluminum, copper, tungsten, molybdenum, and cobalt). Although not shown, additional metal layers M4, M5, M6, M7, or the like may be further stacked on the fifth interlayer insulating layer 150. Each of the stacked metal layers may include routing lines.

Figure 10:
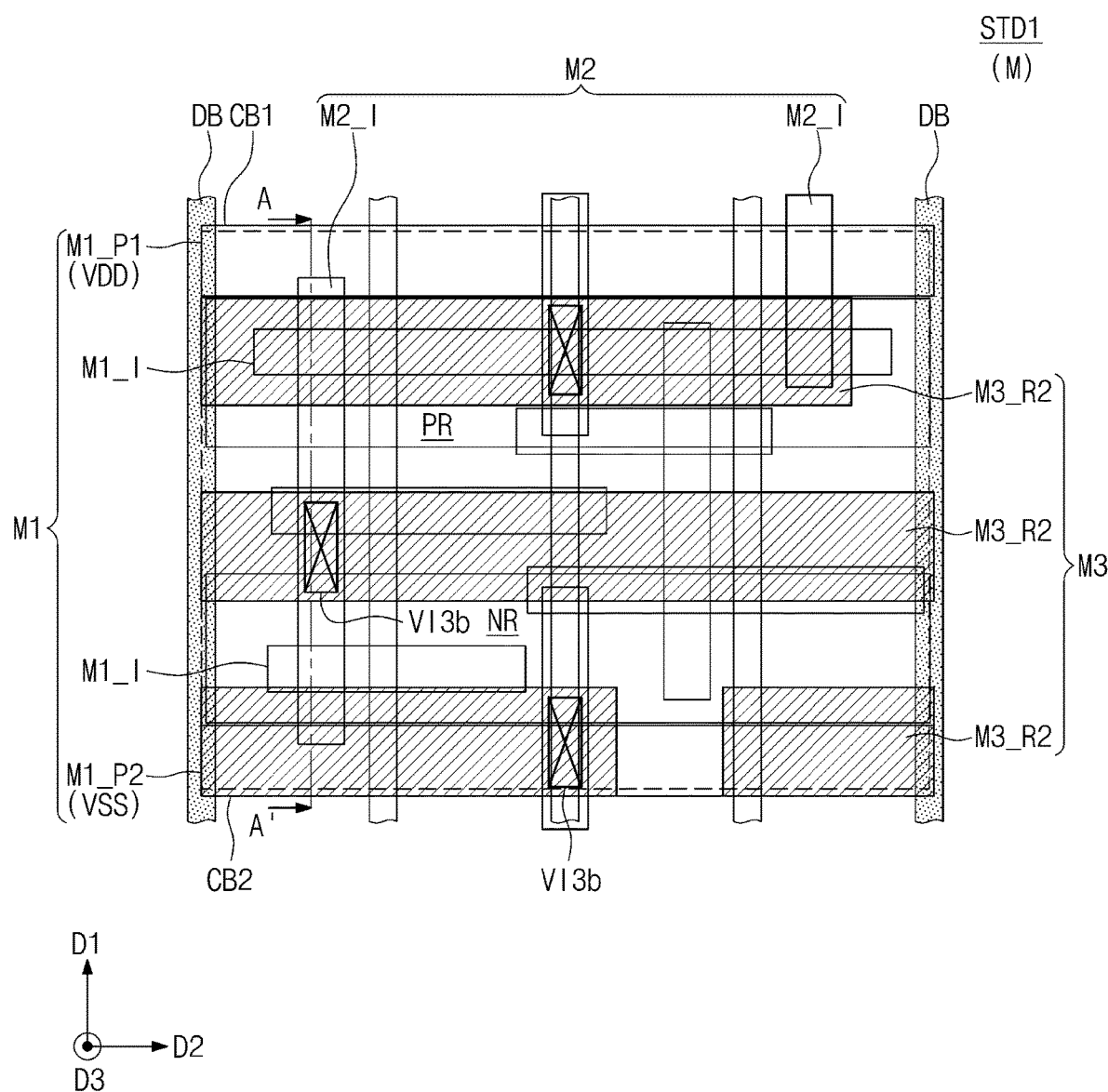
FIG. 10 is a plan view illustrating a portion (e.g., a first standard cell in a second region) of a semiconductor device, according to an example embodiment of the inventive concept.
Figure 11:
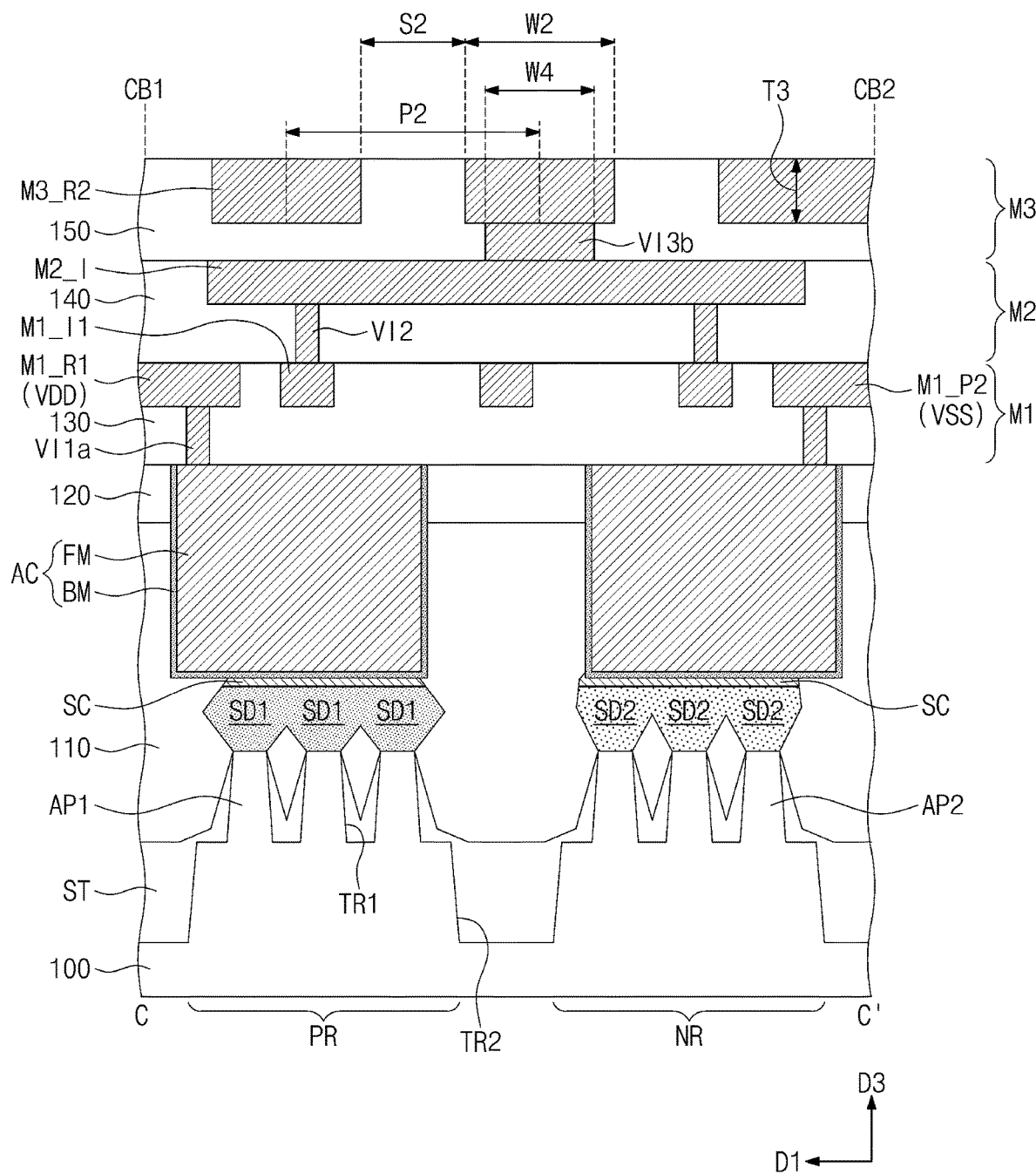
FIG. 11 is a sectional view taken along a line A-A' of FIG. 10.

FIG. 10 is a plan view illustrating a portion (e.g., a first standard cell in a second region) of a semiconductor device, according to an example embodiment of the inventive concept. FIG. 11 is a sectional view taken along a line A-A' of FIG. 10. The semiconductor device of FIGS. 10 and 11 may be an example of the first standard cell STD1 of the second region M of the second module MOD2, which is actually realized on a substrate using the layout of FIG. 7B. For concise description, an element previously described with reference to FIGS. 1, 8, and 9A to 9D may be identified by the same reference number without repeating an overlapping description thereof.

Referring to FIGS. 1, 10, and 11, the first standard cell STD1, which is one of logic cells, may be provided on the second module MOD2, which is one of the performance-oriented modules. Logic transistors constituting the logic circuit may be disposed on the first standard cell STD1.

The third metal layer M3 of the second region M may include second routing lines M3_R2. The second routing lines M3_R2 may be structures formed using the layout of the second routing patterns M3a_R2 of FIG. 7B.

Each of the second routing lines M3_R2 may be a line- or bar-shaped pattern extending lengthwise in the second direction D2. The second routing lines M3_R2 may be arranged in the first direction D1 with the second pitch P2. A line width of each of the second routing lines M3_R2 may be the second width W2. Adjacent ones of the second routing lines M3_R2 may be spaced apart from each other in the first direction D1 by the smallest space of the second space S2.

The second width W2 of the second routing line M3_R2 may be greater than the first width W1 of the first routing line M3_R1. For example, the second width W2 may be 1.1 to 3.0 times the first width W1. The second space S2 of the second routing lines M3_R2 may be greater than the first space S1 of the first routing lines M3_R1. For example, the second space S2 may be 1.0 to 3.0 times the first space S1. The second pitch P2 of the second routing lines M3_R2 may be 1.1 to 6.0 times the first pitch P1 of the first routing lines M3_R1. In some embodiments, the second pitch P2 may be 1.5 to 4.0 times the first pitch P1.

A thickness of the second routing line M3_R2 may be greater than a thickness of the first routing line M3_R1. The second routing line M3_R2 may have a third thickness T3. The third thickness T3 may be greater than the second thickness T2 of the first routing line M3_R1. Since the line width W2 of the second routing lines M3_R2 are greater than the line width W1 of the first routing lines M3_R1, the second routing lines M3_R2 are formed to be deeper in the fifth interlayer insulating layer 150 than the first routing lines M3_R1.

The third metal layer M3 of the second region M may further include third large vias VI3b. The third large vias VI3b may be provided below the second routing lines M3_R2. The second routing lines M3_R2 may be electrically connected to the second interconnection lines M2_I through the third large vias VI3b. Each of the third large vias VI3b may have a fourth width W4 in the first direction D1. The fourth width W4 may be smaller than the second width W2. The fourth width W4 may be the smallest size of a via defined by a design rule for the third metal layer M3 on the second region M.

The fourth width W4 may be greater than the third width W3 of the third via VI3a. Since the second routing line M3_R2 has a relatively large line width (e.g., second width W2), a via under the second routing line M3_R2 may be also provided to have an increased size.

The number of the first routing lines M3_R1 disposed on the first region L may be greater than the number of the second routing lines M3_R2 disposed on the second region M, which has the same area as the first region L. For example, a pattern density of the third metal layer M3 of the first region L may be greater than a pattern density of the third metal layer M3 of the second region M.

Since the third metal layer M3 of the first region L has a relatively high pattern density, an integration density of the first region L may be increased. Since the third metal layer M3 of the second region M has an interconnection line and a via whose sizes are relatively large, an electrical resistance of the third metal layer M3 may be reduced. Accordingly, it may be possible to increase an operation speed of the second module MOD2, which is one of the performance-oriented modules.

Figure 12:
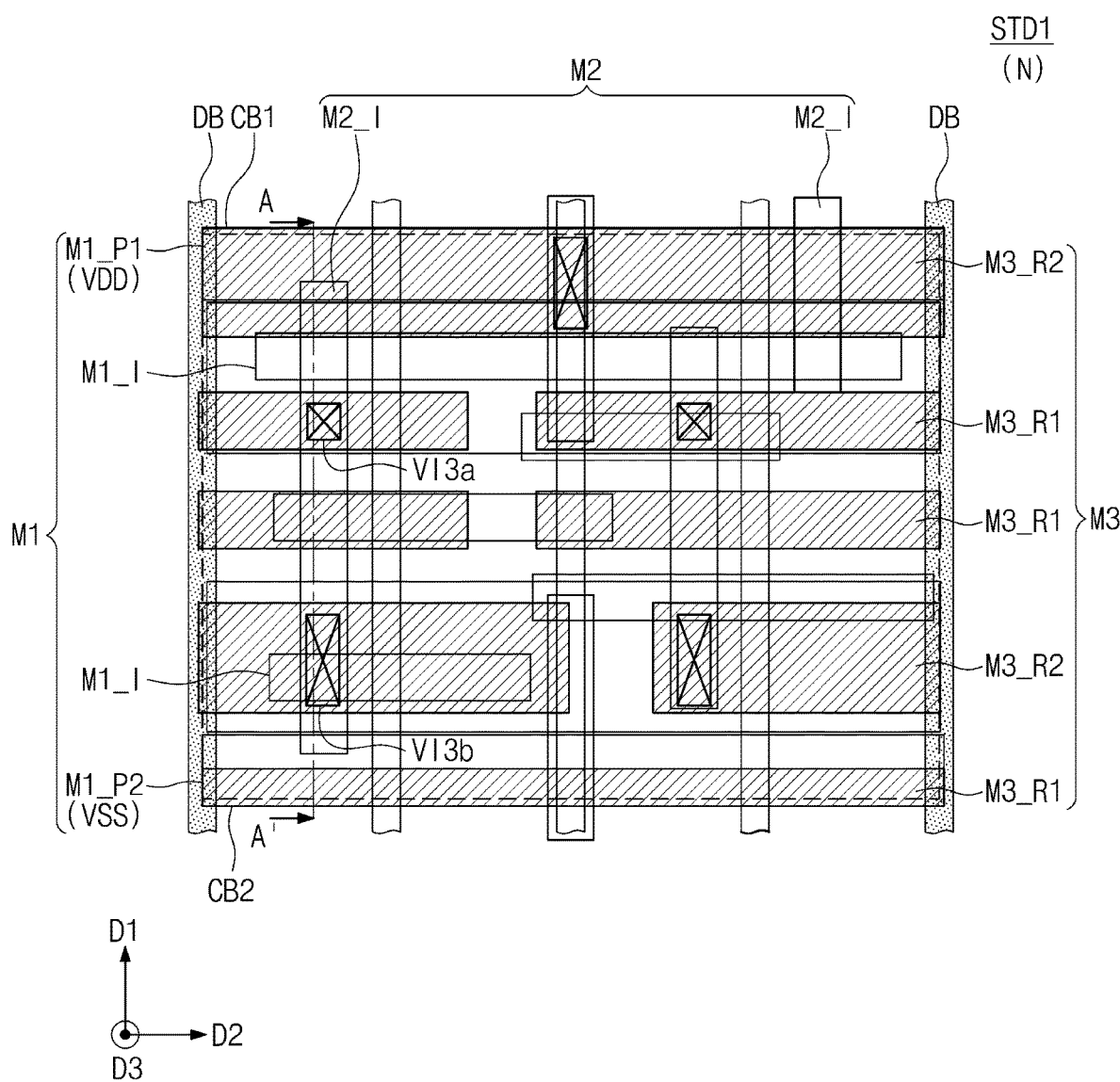
FIG. 12 is a plan view illustrating a portion (e.g., a first standard cell of a third region) of a semiconductor device, according to an example embodiment of the inventive concept.
Figure 13:
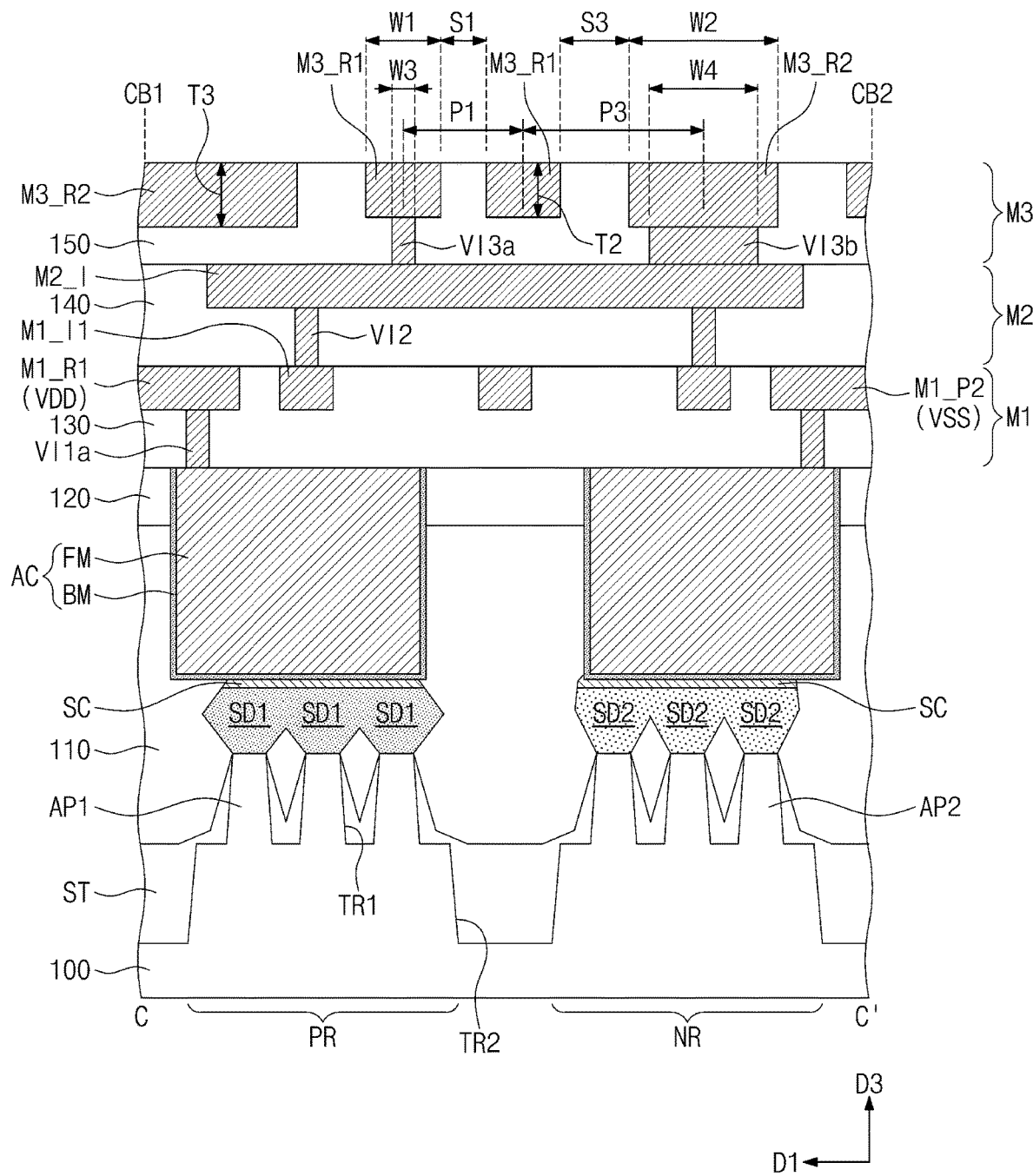
FIG. 13 is a sectional view taken along a line A-A' of FIG. 12.

FIG. 12 is a plan view illustrating a portion (e.g., a first standard cell of a third region) of a semiconductor device, according to an example embodiment of the inventive concept. FIG. 13 is a sectional view taken along a line A-A' of FIG. 12. The semiconductor device of FIGS. 12 and 13 may be an example of the first standard cell STD1 of the third region N of the third module MOD3, which is actually realized on a substrate using the layout of FIG. 7C. In the following description of the present embodiment, an element previously described with reference to FIGS. 1, 8, and 9A to 9D may be identified by the same reference number without repeating an overlapping description thereof.

Referring to FIGS. 1, 12, and 13, the first standard cell STD1, which is one of logic cells, may be provided on the third module MOD3, which is one of the performance-oriented modules. Logic transistors constituting the logic circuit may be disposed on the first standard cell STD1.

The third metal layer M3 of the third region N may include the first and second routing lines M3_R1 and M3_R2. The first and second routing lines M3_R1 and M3_R2 may be structures formed using the layout of the first and second routing patterns M3a_R1 and M3a_R2 of FIG. 7C.

Each of the first and second routing lines M3_R1 and M3_R2 may be a line- or bar-shaped pattern extending lengthwise in the second direction D2. The first and second routing lines M3_R1 and M3_R2 may be arranged in the first direction D1 with at least two different pitches. A pitch between the first and second routing lines M3_R1 and M3_R2, which are adjacent to each other, may be the third pitch P3. A pitch between adjacent ones of the first routing lines M3_R1 may be the first pitch P1, which is smaller than the third pitch P3. For example, the third pitch P3 may be 1.1 to 6.0 times the first pitch P1. In some embodiments, the third pitch P3 may be 1.5 to 3.0 times the first pitch P1.

A line width of the first routing line M3_R1 may be the first width W1. A line width of the second routing line M3_R2 may be the second width W2, which is greater than the first width W1. The first routing line M3_R1 and the second routing line M3_R2, which are adjacent to each other, may be spaced apart from each other in the first direction D1 by the smallest space of the third space S3. Adjacent ones of the first routing lines M3_R1 may be spaced apart from each other in the first direction D1 by the smallest space of the first space S1. The third space S3 may be 1.0 to 3.0 times the first space S1.

The second routing lines M3_R2 may have the third thickness T3, and the first routing lines M3_R1 may have the second thickness T2, which is smaller than the third thickness T3. Accordingly, the first and second routing lines M3_R1 and M3_R2, which are provided in common in the third metal layer M3, may have bottom surfaces located at different levels.

In an example embodiment, as shown in FIGS. 12 and 13, a pair of the first routing lines M3_R1 may be disposed between the adjacent pair of the second routing lines M3_R2. In another example embodiments, 1 to 10 first routing lines M3_R1 may be disposed between the adjacent pair of the second routing line M3_R2, although not shown.

The third metal layer M3 of the third region N may further include the third vias VI3a and the third large vias VI3b. The third vias VI3a may be provided below the first routing lines M3_R1, and the third large vias VI3b may be provided below the second routing lines M3_R2. A width W4 of the third large via VI3b may be greater than a width W3 of the third via VI3a.

According to the present embodiment, the third metal layer M3 of the third region N may include the interconnection line M3_R2 and the via VI3b, which have relatively large sizes, and this may make it possible to reduce an electrical resistance of the third metal layer M3. Accordingly, it may be possible to increase an operation speed of the third module MOD3. In addition, the third metal layer M3 of the third region N may include the interconnection line M3_R1 and the via VI3a, which have relatively small sizes, and this may make it possible to increase an integration density of the third metal layer M3. Accordingly, it may be possible to reduce an area of the third module MOD3.

In a semiconductor device according to an example embodiment of the inventive concept, the routing metal layer (e.g., the third metal layer M3) on the standard cells of the area-oriented region may be configured to include routing lines having small widths and small pitches, and thus, an integration density may be increased. The routing metal layer (e.g., the third metal layer M3) on the standard cells of the performance-oriented region may be configured to include routing lines having large widths and large pitches, and thus, an operation speed may be increased.

The inventive concept is not limited to the third metal layer M3 exemplarily illustrated in FIGS. 8 to 13 and may be applied to high-level metal layers M4, M5, M6, M7, or the like, which are provided on the third metal layer M3, in the same manner. For example, the inventive concept may be applied to any of the routing metal layers M3, M4, M5, M6, M7, or the like provided with the routing lines.

FIGS. 14A to 14D are sectional views, which are respectively taken along the lines A-A', B-B', C-C', and D-D' of FIG. 8 to illustrate a semiconductor device according to an example embodiment of the inventive concept. For concise description, an element previously described with reference to FIGS. 1, 8, and 9A to 9D may be identified by the same reference number without repeating an overlapping description thereof.

Referring to FIGS. 1, 8, and 14A to 14D, the first standard cell STD1, which is a logic cell, may be provided on the first region L of the first module MOD1. The substrate 100 may include the first active region PR and the second active region NR. The device isolation layer ST may be provided on the substrate 100. The device isolation layer ST may define the first active pattern AP1 and the second active pattern AP2 in an upper portion of the substrate 100. The first and second active patterns AP1 and AP2 may be defined on the first and second active regions PR and NR, respectively.

The first active pattern AP1 may include the first channel patterns CH1, which are vertically stacked on the substrate 100. The stacked first channel patterns CH1 may be spaced apart from each other in the third direction D3. The stacked first channel patterns CH1 may be overlapped with each other, when viewed in a plan view. The second active pattern AP2 may include the second channel patterns CH2, which are vertically stacked on the substrate 100. The stacked second channel patterns CH2 may be spaced apart from each other in the third direction D3. The stacked second channel patterns CH2 may be overlapped with each other, when viewed in a plan view. The first and second channel patterns CH1 and CH2 may be formed of or may include at least one of silicon (Si), germanium (Ge), or silicon germanium (SiGe).

The first active pattern AP1 may further include the first source/drain patterns SD1. The stacked first channel patterns CH1 may be interposed between each adjacent pair of the first source/drain patterns SD1. The stacked first channel patterns CH1 may connect each adjacent pair of the first source/drain patterns SD1 to each other.

The second active pattern AP2 may further include the second source/drain patterns SD2. The stacked second channel patterns CH2 may be interposed between each adjacent pair of the second source/drain patterns SD2. The stacked second channel patterns CH2 may connect each adjacent pair of the second source/drain patterns SD2 to each other.

The gate electrodes GE may be provided to extend lengthwise in the first direction D1 and to cross the first and second channel patterns CH1 and CH2. The gate electrode GE may be overlapped with the first and second channel patterns CH1 and CH2, when viewed in a plan view. A pair of the gate spacers GS may be disposed on both side surfaces of the gate electrode GE. The gate capping pattern GP may be provided on the gate electrode GE.

Figure 14A:
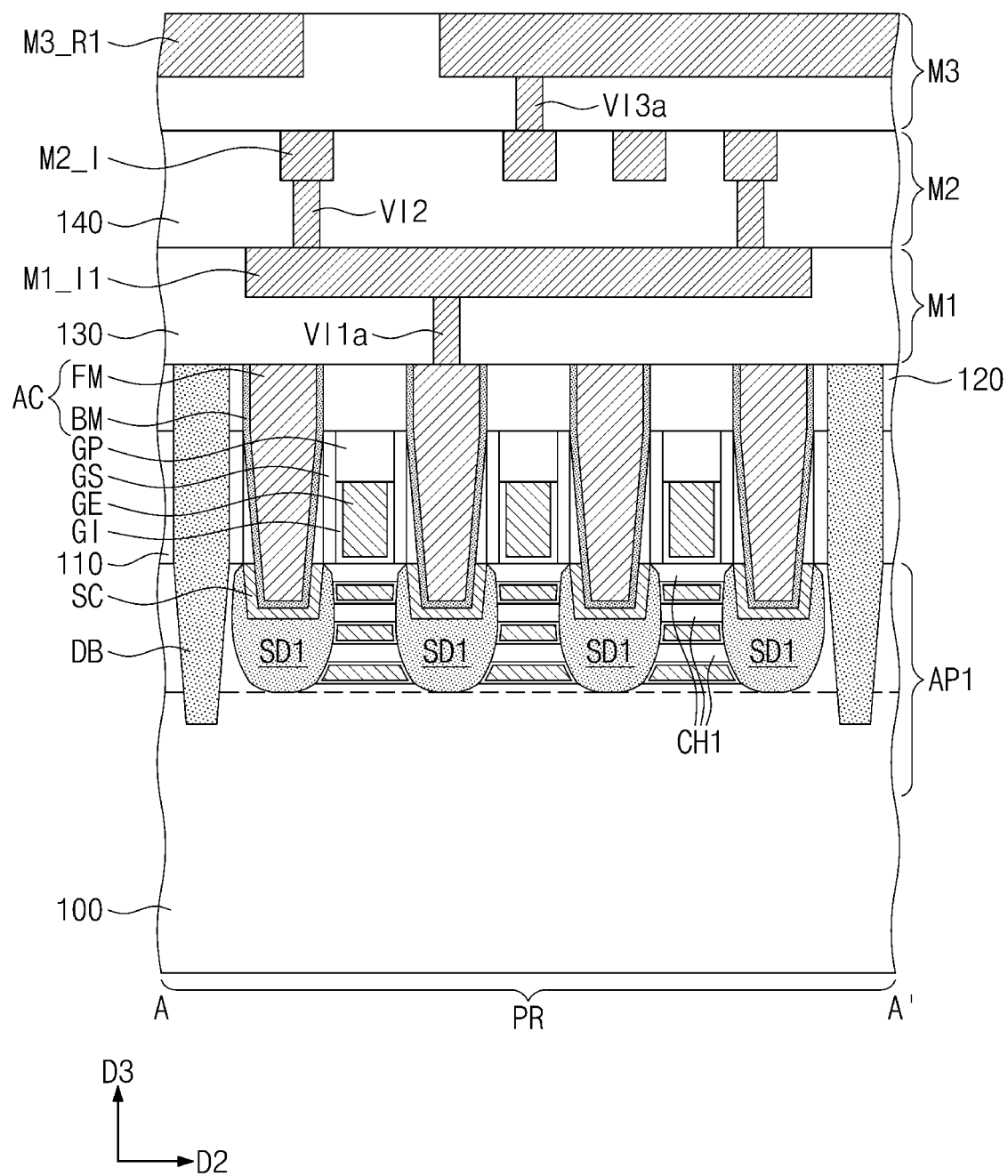
FIGS. 14A to 14D are sectional views, which are respectively taken along the lines A-A', B-B', C-C' and D-D' of FIG. 8 to illustrate a semiconductor device, according to an example embodiment of the inventive concept.
Figure 14B:
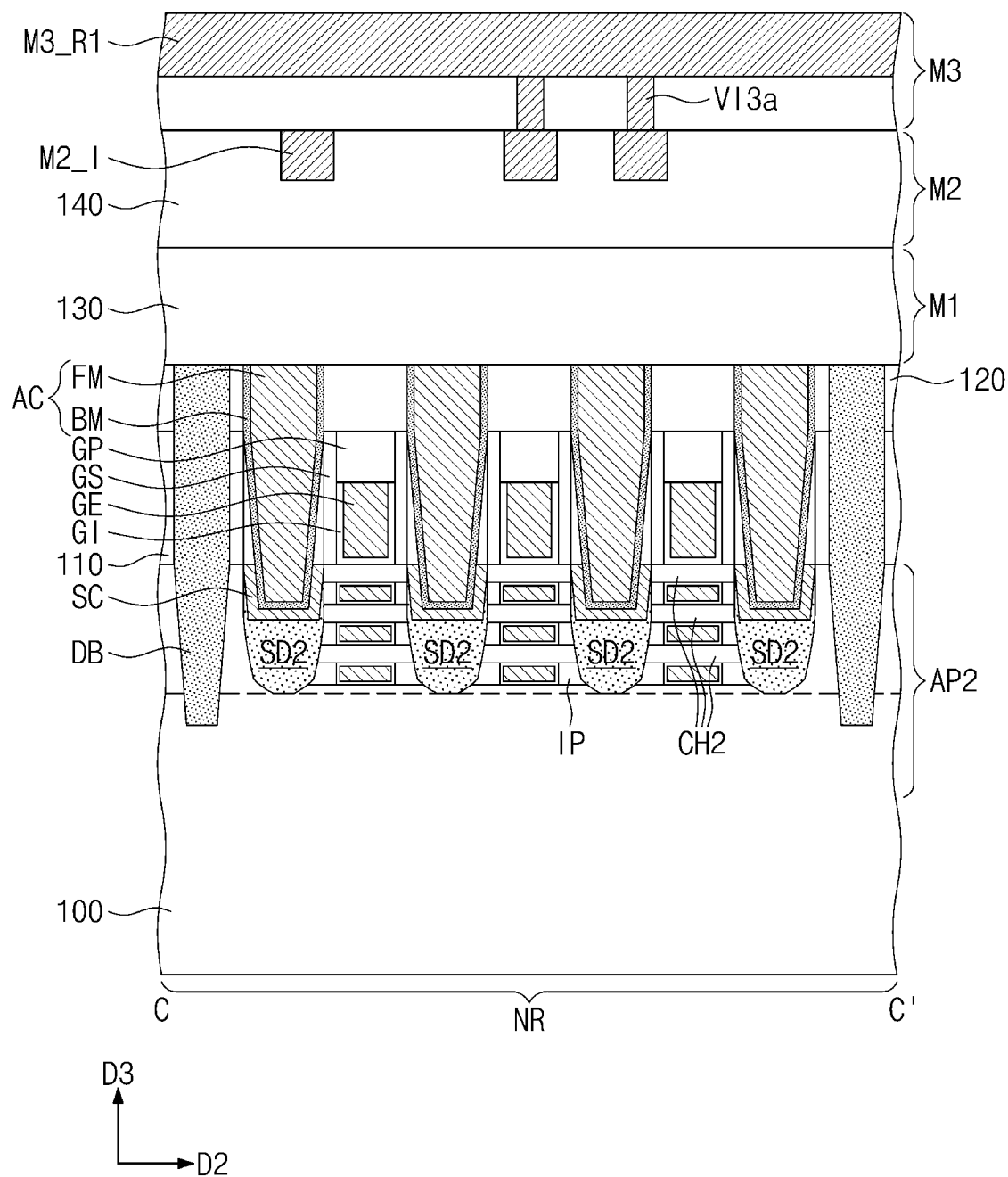
Figure 14C:
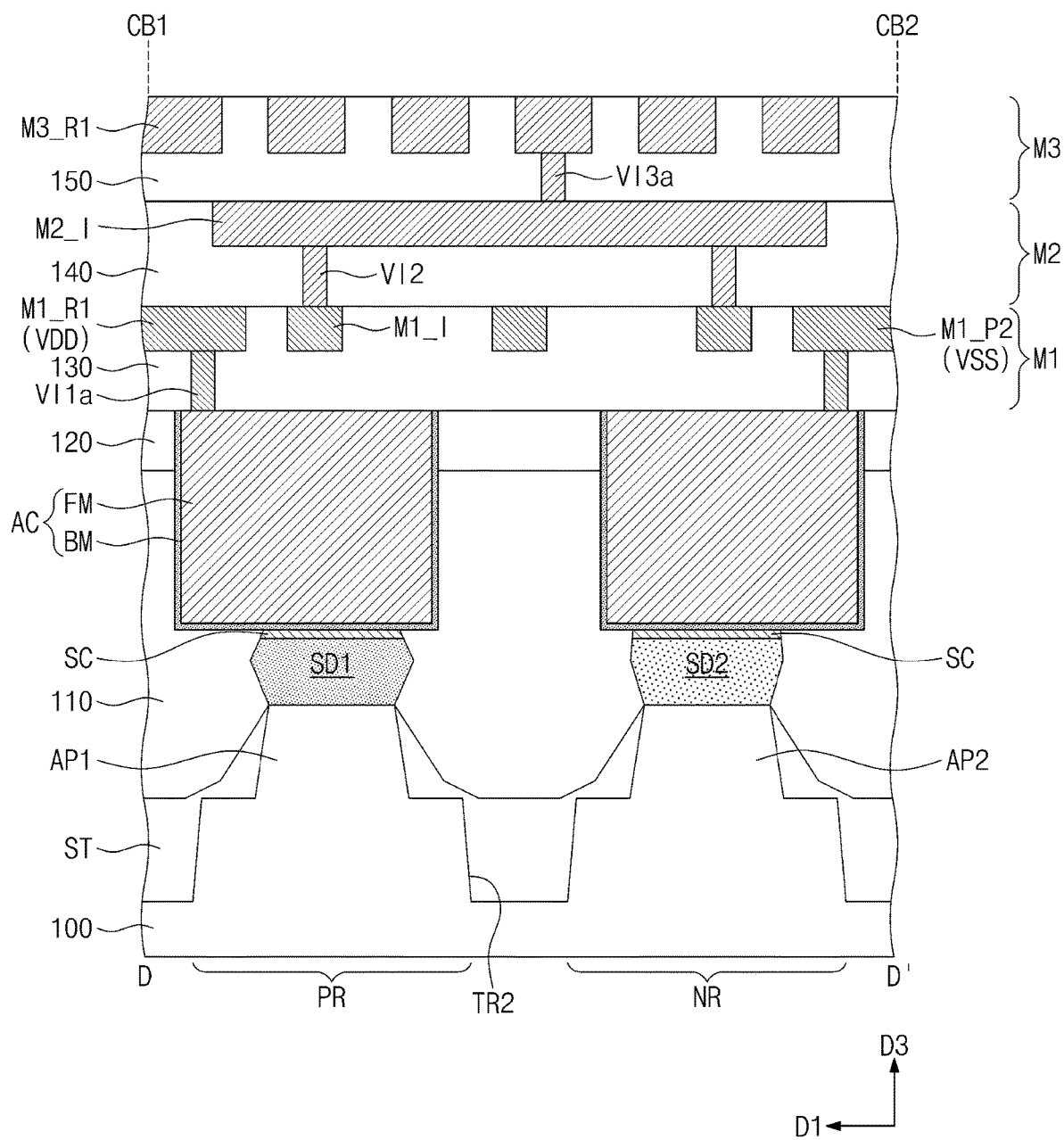
Figure 14D:
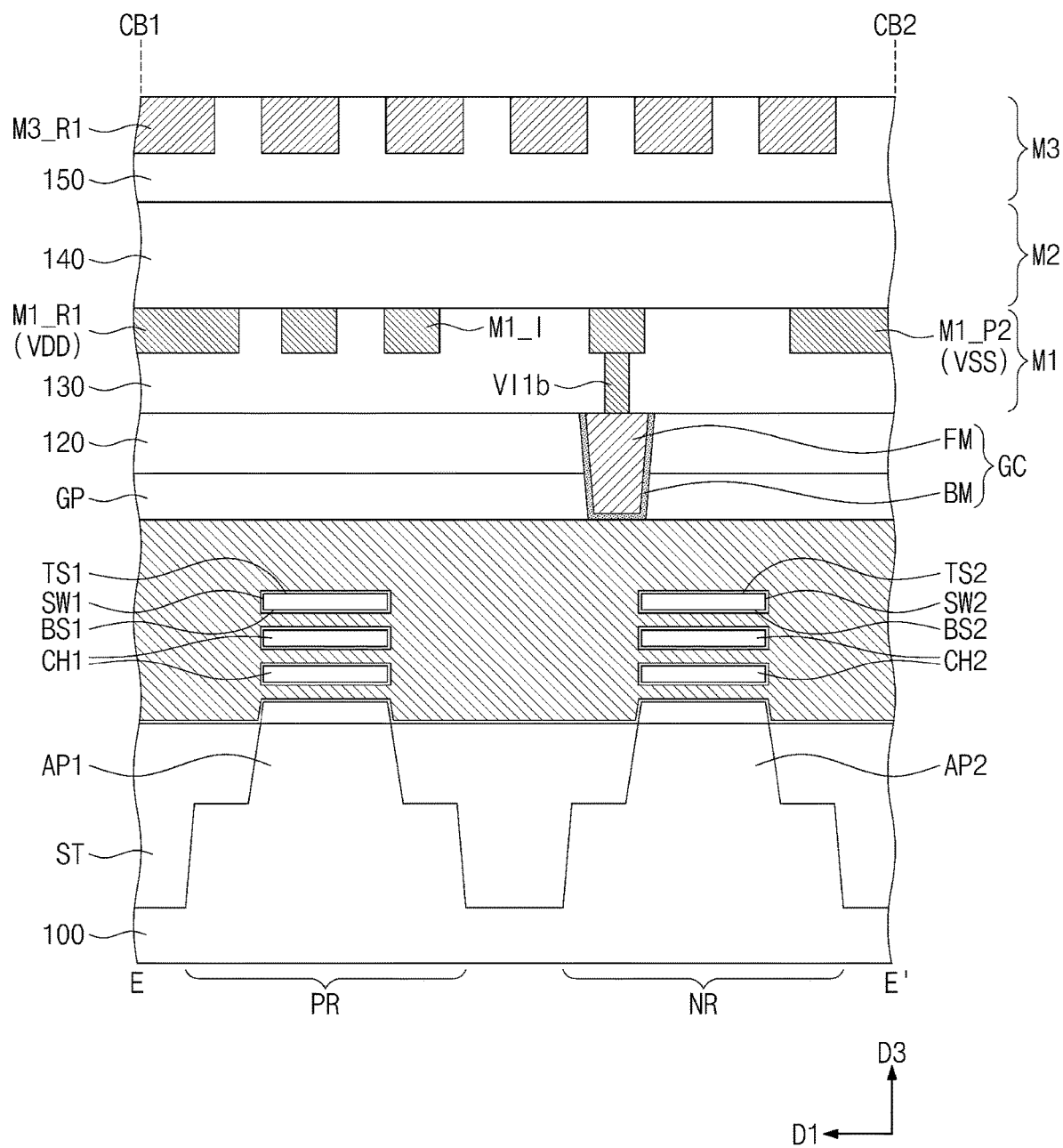

The gate electrode GE may be provided to surround each of the first and second channel patterns CH1 and CH2 (e.g., see FIG. 14D). The gate electrode GE may be provided on the first top surface TS1, at least one of the first side surfaces SW1, and a first bottom surface BS1 of the first channel pattern CH1. The gate electrode GE may be provided on the second top surface TS2, at least one of the second side surfaces SW2, and a second bottom surface BS2 of the second channel pattern CH2. For example, the gate electrode GE may surround a top surface, a bottom surface, and both side surfaces of each of the first and second channel patterns CH1 and CH2. The transistor according to the present embodiment may be a three-dimensional field effect transistor (e.g., a multi-bridge channel field-effect transistor (MBCFET)), in which the gate electrode GE is disposed to three-dimensionally surround the channel patterns CH1 and CH2.

The gate dielectric pattern GI may be provided between each of the first and second channel patterns CH1 and CH2 and the gate electrode GE. The gate dielectric pattern GI may surround each of the first and second channel patterns CH1 and CH2.

On the second active region NR, an insulating pattern IP may be interposed between the gate dielectric pattern GI and the second source/drain pattern SD2. The gate electrode GE may be spaced apart from the second source/drain pattern SD2 by the gate dielectric pattern GI and the insulating pattern IP. By contrast, on the first active region PR, the insulating pattern IP may be omitted.

The first interlayer insulating layer 110 and the second interlayer insulating layer 120 may be provided to cover the substrate 100. The active contacts AC may be provided to penetrate the first and second interlayer insulating layers 110 and 120 and may be connected to the first and second source/drain patterns SD1 and SD2, respectively. The gate contact GC may be provided to penetrate the second interlayer insulating layer 120 and the gate capping pattern GP and may be electrically connected to the gate electrode GE.

The third interlayer insulating layer 130, the fourth interlayer insulating layer 140, and the fifth interlayer insulating layer 150 may be sequentially provided on the second interlayer insulating layer 120.

The first metal layer M1 may be provided in the third interlayer insulating layer 130. The second metal layer M2 may be provided in the fourth interlayer insulating layer 140. The third metal layer M3 may be provided in the fifth interlayer insulating layer 150. Although not shown, additional metal layers M4, M5, M6, M7, or the like may be disposed on the third metal layer M3. The third metal layer M3 and the metal layers thereon may be routing metal layers provided with routing lines. The first metal layer M1, the second metal layer M2, and the third metal layer M3 may be configured to have substantially the same features as those previously described with reference to FIGS. 8 and 9A to 9D.

Although not shown, MBCFETs previously described as the logic transistors may be provided on the second region M of the second module MOD2 and the third region N of the third module MOD3. Alternatively, the FinFETs previously described as the logic transistors may be provided on at least one of the second region M of the second module MOD2 and the third region N of the third module MOD3.

According to an example embodiment of the inventive concept, a routing metal layer of a high pattern density may be provided in an area-oriented region of a semiconductor chip, and this may make it possible to increase an integration density of a semiconductor device. A routing metal layer of a low pattern density may be provided in a performance-oriented region of the semiconductor chip, and this may make it possible to reduce an electrical resistance of the routing metal layer and to increase an operation speed of the semiconductor device. As a result, in the semiconductor device according to an example embodiment of the inventive concept, a design rule for a routing metal layer may be set to enhance a specific property (e.g., an integration density or performance) required for each region of the semiconductor chip. Accordingly, routing lines, which are actually fabricated on each region of the semiconductor chip, may have geometrical features (e.g., smallest widths and/or smallest space) optimized for the corresponding region.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
an area-oriented region and a performance-oriented region;
standard cells disposed on each of the area-oriented region and the performance-oriented region; and
a routing metal layer on the standard cells,
wherein each of the standard cells comprises:
a first active pattern on a first active region;
a second active pattern on a second active region;
a gate electrode crossing the first and second active patterns;
a first source/drain pattern provided on the first active pattern and to a side of the gate electrode;
a second source/drain pattern provided on the second active pattern and to a side of the gate electrode;
a gate contact on the gate electrode;
an active contact on each of the first and second source/drain patterns;
a first metal layer including first interconnection lines provided on the gate contact and the active contact; and
a second metal layer including second interconnection lines provided on the first metal layer,
wherein the routing metal layer is disposed on the second metal layer,
wherein the routing metal layer is located at a higher level than transistors of the standard cells,
wherein the routing metal layer comprises:
first routing lines on the area-oriented region; and
second routing lines on the performance-oriented region,
wherein a smallest line width of the first routing lines is a first width,
wherein a smallest line width of the second routing lines is a second width greater than the first width,
wherein a pitch between the first routing lines is a first pitch, and
wherein a pitch between the second routing lines is a second pitch greater than the first pitch.

2. The semiconductor device of claim 1, wherein the routing metal layer is one of a third metal layer and metal layers provided thereon.

3. The semiconductor device of claim 1, wherein a thickness of the first routing lines is smaller than a thickness of the second routing lines.

4. The semiconductor device of claim 1, wherein the second width is 1.1 to 3.0 times the first width.

5. The semiconductor device of claim 1, wherein the second pitch is 1.1 to 6.0 times the first pitch.

6. The semiconductor device of claim 1,
wherein the routing metal layer further comprises third routing lines on the performance-oriented region,
wherein a smallest line width of the third routing lines is smaller than the second width, and
wherein a number of the third routing lines disposed between adjacent ones of the second routing lines is 1 to 10.

7. The semiconductor device of claim 6, wherein a thickness of the third routing lines is smaller than a thickness of the second routing lines.

8. The semiconductor device of claim 1, wherein the routing metal layer further comprises:
a first via disposed below at least one of the first routing lines; and
a second via disposed below at least one of the second routing lines,
wherein a width of the first via is smaller than a width of the second via.

9. The semiconductor device of claim 1,
wherein the area-oriented region is a region of a first module of a semiconductor chip,
wherein the performance-oriented region is a region of a second module of the semiconductor chip,
wherein the first module comprises a memory controller, a nonvolatile memory controller, or a universal serial bus (USB) interface, and
wherein the second module comprises a central processing unit (CPU) or a graphics processing unit (GPU).

10. A semiconductor device, comprising:
an area-oriented region and a performance-oriented region;
standard cells disposed on the area-oriented region and the performance-oriented region; and
a routing metal layer on the standard cells,
wherein the routing metal layer is one of a third metal layer and metal layers provided thereon and comprises:
first routing lines extending lengthwise in a first direction on the area-oriented region;
second routing lines extending lengthwise in the first direction on the performance-oriented region;
a first via disposed below at least one of the first routing lines; and
a second via disposed below at least one of the second routing lines,
wherein each of the standard cells comprises:
a first active pattern on a first active region;
a second active pattern on a second active region;
a gate electrode crossing the first and second active patterns;
a first source/drain pattern provided on the first active pattern and to a side of the gate electrode;
a second source/drain pattern provided on the second active pattern and to a side of the gate electrode;
a gate contact on the gate electrode;
an active contact on each of the first and second source/drain patterns;
a first metal layer including first interconnection lines provided on the gate contact and the active contact; and
a second metal layer including second interconnection lines provided on the first metal layer,
wherein the routing metal layer is disposed on the second metal layer,
wherein a smallest line width of the first routing lines is smaller than a smallest line width of the second routing lines,
wherein a pitch between the first routing lines is smaller than a pitch between the second routing lines, and
wherein a width of the first via is smaller than a width of the second via.

11. The semiconductor device of claim 10,
wherein the smallest line width of the second routing lines is 1.1 to 3.0 times the smallest line width of the first routing lines, and wherein the pitch between the second routing lines is 1.1 to 6.0 times the pitch between the first routing lines.

12. The semiconductor device of claim 10,
wherein the area-oriented region is a region of a first module of a semiconductor chip,
wherein the performance-oriented region is a region of a second module of the semiconductor chip,
wherein the first module comprises a memory controller, a nonvolatile memory controller, or a universal serial bus (USB) interface, and
wherein the second module comprises a central processing unit (CPU) or a graphics processing unit (GPU).

13. The semiconductor device of claim 10, wherein a smallest space of the routing metal layer on the area-oriented region is smaller than a smallest space of the routing metal layer on the performance-oriented region.

14. A semiconductor device, comprising:
an area-oriented region and a performance-oriented region;
standard cells disposed on each of the area-oriented region and the performance-oriented region, each of the standard cells comprising:
 a first active pattern on a first active region;
 a second active pattern on a second active region;
 a gate electrode crossing the first and second active patterns;
 a first source/drain pattern provided on the first active pattern and to a side of the gate electrode;
 a second source/drain pattern provided on the second active pattern and to a side of the gate electrode;
 a gate contact on the gate electrode;
 an active contact on each of the first and second source/drain patterns;
 and
a routing metal layer disposed on the standard cells, the routing metal layer comprising:
 first routing lines on the area-oriented region; and
 second routing lines on the performance-oriented region,
wherein a smallest line width of the first routing lines is smaller than a smallest line width of the second routing lines, and
wherein a pitch between the first routing lines is smaller than a pitch between the second routing lines.

15. The semiconductor device of claim 14, wherein the smallest line width of the second routing lines is 1.1 to 3.0 times the smallest line width of the first routing lines.

16. The semiconductor device of claim 14, wherein the pitch between the second routing lines is 1.1 to 6.0 times the pitch between the first routing lines.

17. The semiconductor device of claim 14,
wherein the area-oriented region is a region of a first module of a semiconductor chip,
wherein the performance-oriented region is a region of a second module of the semiconductor chip,
wherein the first module comprises a memory controller, a nonvolatile memory controller, or a universal serial bus (USB) interface, and
wherein the second module comprises a central processing unit (CPU) or a graphics processing unit (GPU).

* * * * *